(12) United States Patent
Lee et al.

(10) Patent No.: US 10,763,167 B2
(45) Date of Patent: Sep. 1, 2020

(54) VERTICAL SEMICONDUCTOR DEVICES AND METHOD OF MANUFACTURING THE SAME

(71) Applicant: Samsung Electronics Co., Ltd., Suwon-si (KR)

(72) Inventors: Kyung-Hwan Lee, Hwaseong-si (KR); Chang-Seok Kang, Seongnam-si (KR); Yong-Seok Kim, Suwon-si (KR); Jun-Hee Lim, Seoul (KR); Kohji Kanamori, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/243,338

(22) Filed: Jan. 9, 2019

(65) Prior Publication Data
US 2019/0363014 A1 Nov. 28, 2019

(30) Foreign Application Priority Data
May 23, 2018 (KR) ........................ 10-2018-0058097

(51) Int. Cl.
| H01L 21/768 | (2006.01) |
|---|---|
| H01L 23/522 | (2006.01) |
| H01L 27/115 | (2017.01) |
| H01L 21/3213 | (2006.01) |
| H01L 21/311 | (2006.01) |

(52) U.S. Cl.
CPC .. *H01L 21/76885* (2013.01); *H01L 21/32139* (2013.01); *H01L 21/76802* (2013.01); *H01L 21/76834* (2013.01); *H01L 23/5226* (2013.01); *H01L 21/31105* (2013.01); *H01L 21/32135* (2013.01); *H01L 27/115* (2013.01)

(58) Field of Classification Search
CPC ....... H01L 21/76885; H01L 21/76829–76834; H01L 21/768–76802; H01L 21/3213–32139; H01L 23/522; H01L 23/5226; H01L 27/115; H01L 27/11517–11582
See application file for complete search history.

(56) References Cited

U.S. PATENT DOCUMENTS

| 9,202,780 B2 | 12/2015 | Lee et al. |
|---|---|---|
| 9,343,452 B2 | 5/2016 | Yun et al. |
| 9,355,913 B2 | 5/2016 | Park et al. |
| 9,373,540 B2 | 6/2016 | Hyun |
| 9,640,542 B2 | 5/2017 | Lee et al. |
| 9,768,193 B2 | 9/2017 | Lee et al. |
| 9,831,180 B2 | 11/2017 | Shingu et al. |

(Continued)

*Primary Examiner* — Sonya McCall-Shepard
(74) *Attorney, Agent, or Firm* — Muir Patent Law, PLLC

(57) ABSTRACT

A vertical semiconductor device includes a conductive pattern structure in which insulation patterns and conductive patterns alternately and repeatedly stacked on the substrate. The conductive pattern structure includes an edge portion having a stair-stepped shape. Each of the conductive patterns includes a pad region corresponding to an upper surface of a stair in the edge portion. A pad conductive pattern is disposed to contact a portion of an upper surface of the pad region. A mask pattern is disposed on an upper surface of the pad conductive pattern. A contact plug penetrates the mask pattern to contact the pad conductive pattern.

20 Claims, 28 Drawing Sheets

(56) References Cited

U.S. PATENT DOCUMENTS

| | | |
|---|---|---|
| 9,871,053 B2 | 1/2018 | Kwak |
| 2011/0031630 A1* | 2/2011 | Hashimoto ....... H01L 27/11578 |
| | | 257/774 |
| 2015/0255385 A1 | 9/2015 | Lee et al. |
| 2017/0271256 A1 | 9/2017 | Inatsuka |
| 2018/0026046 A1 | 1/2018 | Nam et al. |
| 2018/0166380 A1 | 6/2018 | Park et al. |

* cited by examiner

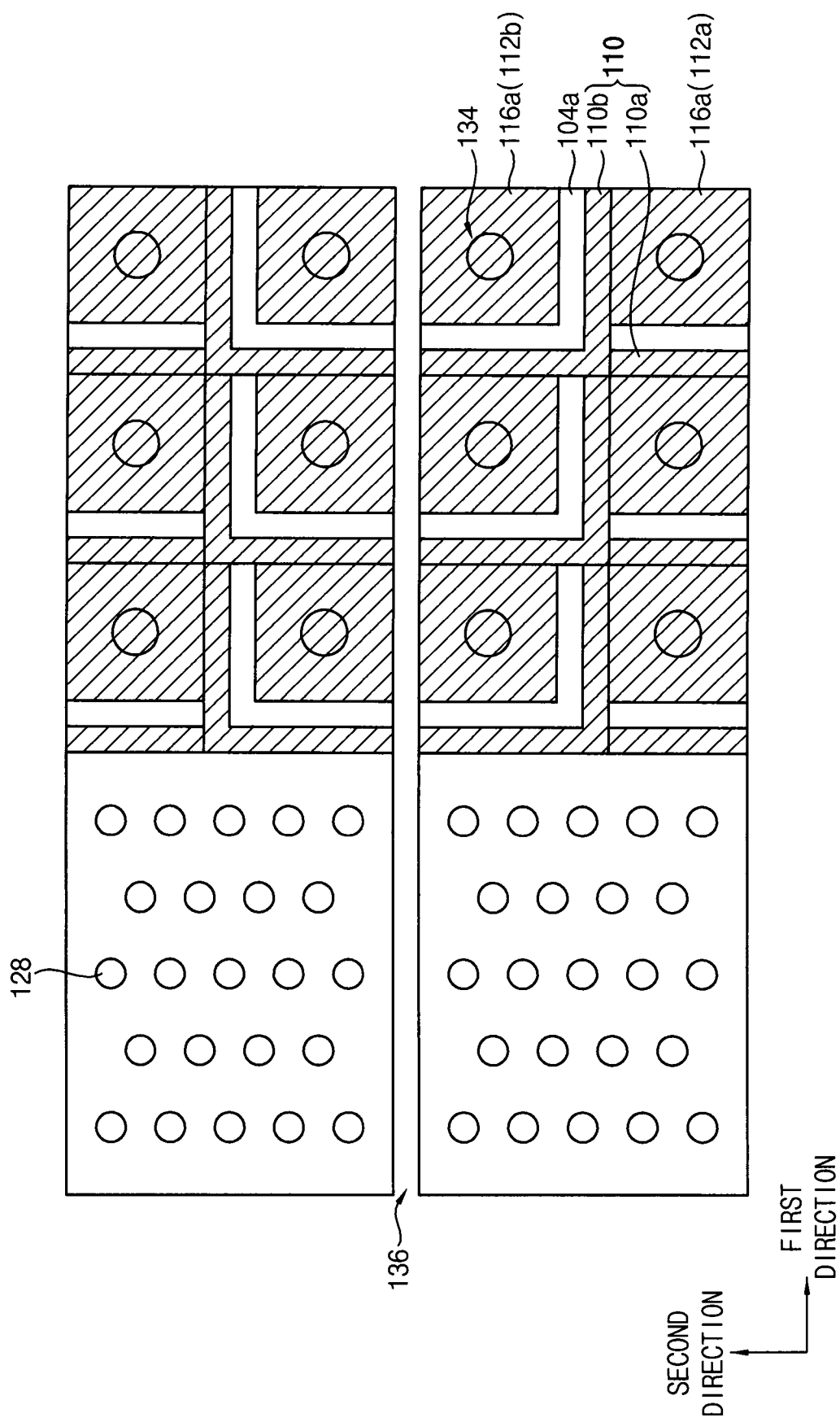

VERTICAL SEMICONDUCTOR DEVICES AND METHOD OF MANUFACTURING THE SAME

CROSS-REFERENCE TO RELATED APPLICATION

This application claims the benefit of priority under 35 U.S.C. § 119 to Korean Patent Application No. 10-2018-0058097, filed May 23, 2018, in the Korean Intellectual Property Office, the disclosure of which is hereby incorporated by reference in its entirety.

TECHNICAL FIELD

Example embodiments of the present disclosure relate to vertical semiconductor devices and, more specifically, to vertical semiconductor devices having structural stability.

DISCUSSION OF RELATED ART

Vertical semiconductor devices in which memory cells vertically stack on a substrate have been developed. The vertical devices may include contact plugs electrically connected to the memory cells, respectively.

SUMMARY

According to example embodiment, the disclosure is directed to a vertical semiconductor device comprising: a substrate; a conductive pattern structure in which insulation patterns and conductive patterns are stacked alternately and repeatedly on the substrate, wherein the conductive pattern structure includes an edge portion having a stair-stepped shape, and each of the conductive patterns includes a pad region having an upper surface that corresponds to an upper surface of a stair in the edge portion; a pad conductive pattern contacting a portion of the upper surface of the pad region; a mask pattern on an upper surface of the pad conductive pattern; and a contact plug penetrating the mask pattern to contact the pad conductive pattern.

According to example embodiment, the disclosure is directed to a vertical semiconductor device comprising: a substrate; a conductive pattern structure in which insulation patterns and conductive patterns are stacked alternately and repeatedly on the substrate, wherein the conductive patterns extend in a first direction parallel to an upper surface of the substrate, edge portions of the conductive patterns have a stair-stepped shape in the first direction and in a second direction perpendicular to the first direction and parallel to the upper surface of the substrate, and the conductive patterns include pad regions corresponding to upper surfaces of stairs, respectively; pad conductive patterns on the pad regions of the conductive patterns, respectively; mask patterns on the pad conductive patterns, respectively; and contact plugs contacting the pad conductive patterns, respectively, and electrically connected to the conductive patterns, respectively.

According to example embodiment, the disclosure is directed to a vertical semiconductor device comprising: a substrate; a conductive pattern structure in which insulation patterns and conductive patterns are stacked alternately and repeatedly on the substrate, wherein the conductive pattern structure includes an edge portion having a stair-stepped shape, and each of the conductive patterns includes a pad region corresponding to an upper surface of a stair in the edge portion; a spacer on a wall of the stair; a pad conductive pattern on the pad region and remotely from the spacer; a mask pattern on an upper surface of the pad conductive pattern; and a contact plug penetrating the mask pattern to contact the pad conductive pattern.

BRIEF DESCRIPTION OF THE DRAWINGS

FIGS. 3 and 4 are a plan view and a perspective view illustrating a vertical semiconductor device according to example embodiments.

DETAILED DESCRIPTION

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
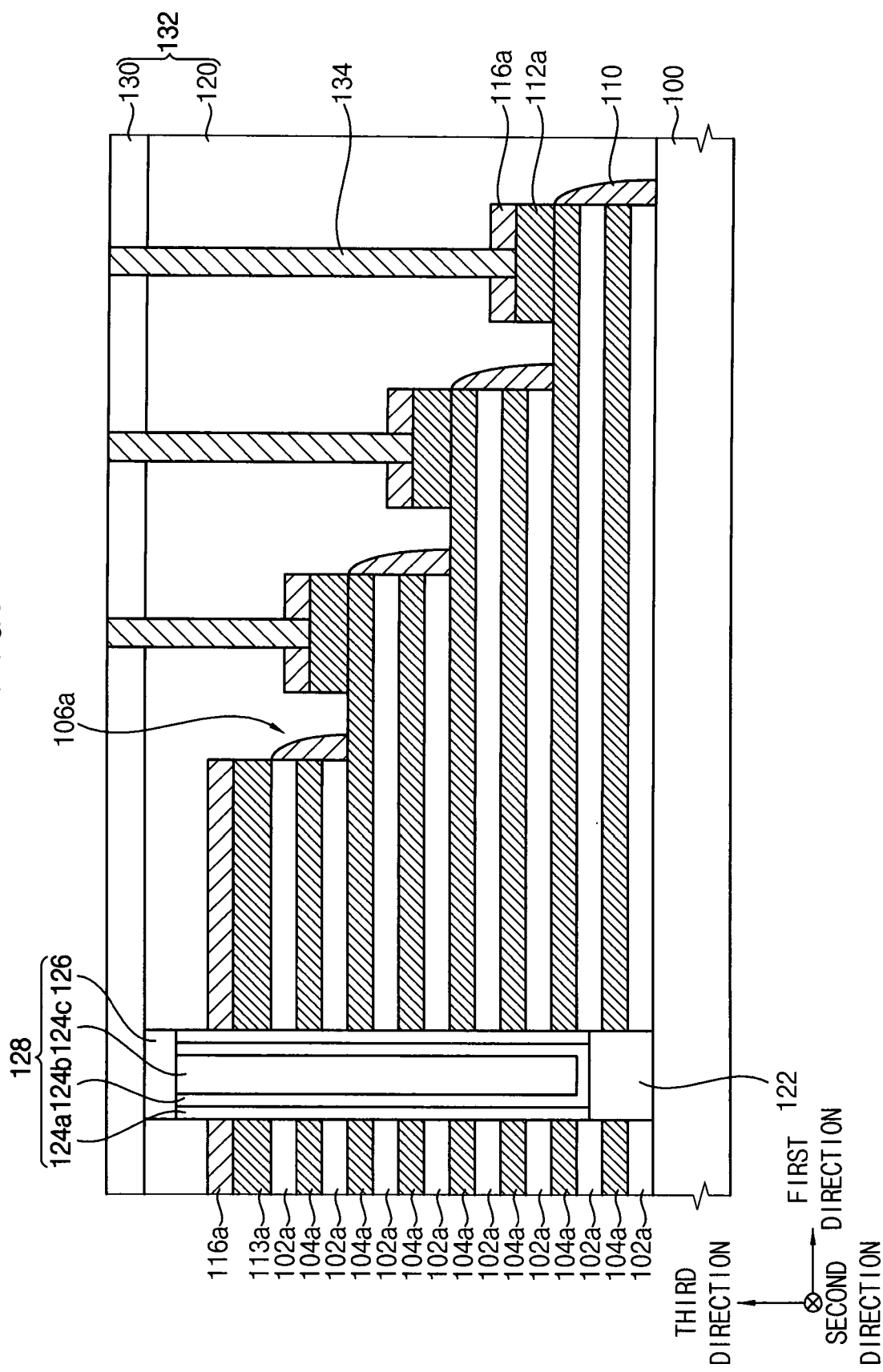
FIG. 1 is a cross-sectional view illustrating a vertical semiconductor device according to example embodiments.
Figure 2A:
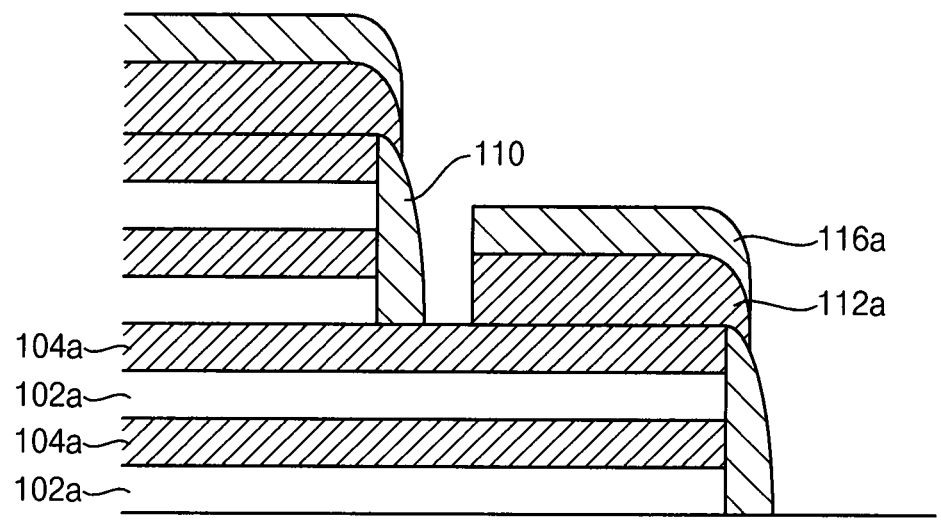
FIGS. 2A, 2B, and 2C are cross-sectional views illustrating a portion of a vertical semiconductor device according to example embodiments.
Figure 2B:
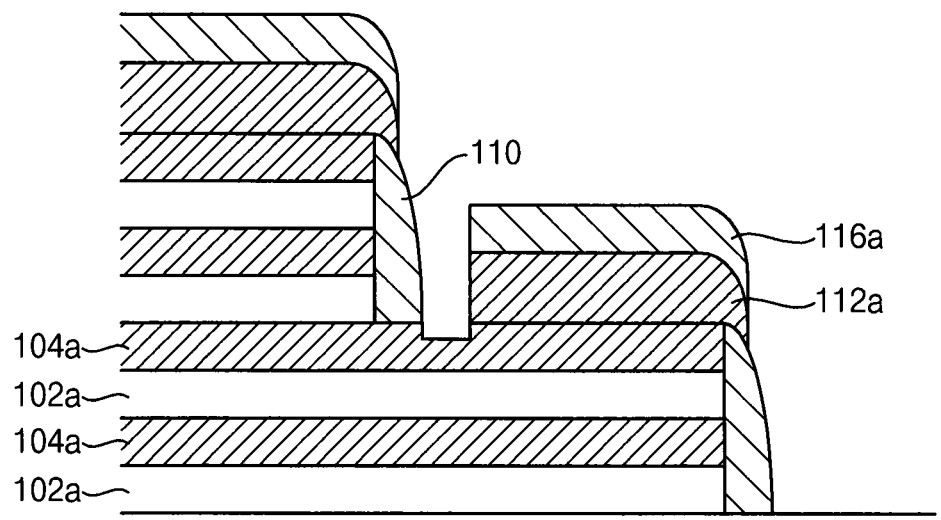
Figure 2C:
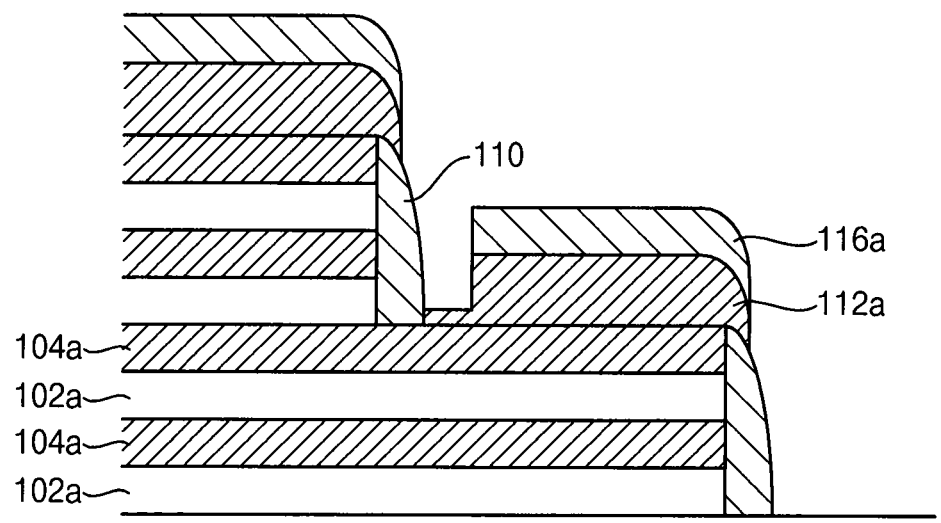
Figure 4:
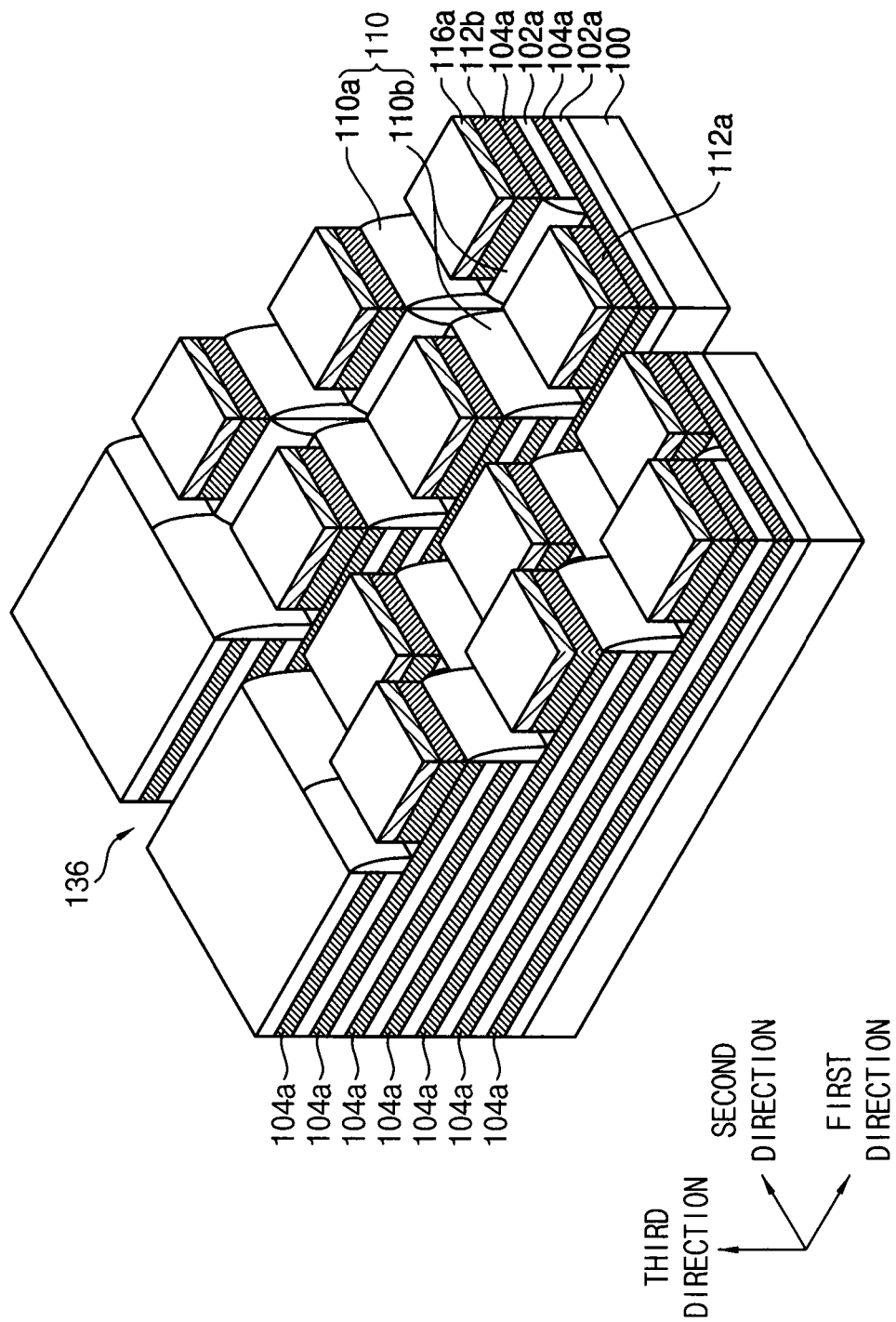

FIG. 1 is a cross-sectional view illustrating a vertical semiconductor device according to example embodiments. FIGS. 2A, 2B, and 2C are cross-sectional views illustrating a portion of a vertical semiconductor device according to example embodiments. FIGS. 3 and 4 are a plan view and a perspective view illustrating a vertical semiconductor device according to example embodiments. In FIG. 4, a contact plug is omitted.

Referring to FIGS. 1 to 4, in a vertical semiconductor device according to example embodiments, a conductive pattern structure 106a may be disposed on a substrate 100. The conductive pattern structure 106a may include insulation patterns 102a and conductive patterns 104a, which are alternately and repeatedly stacked on the substrate 100 in a third direction perpendicular to an upper surface of the substrate 100. Edge portions of the conductive patterns 104a may have a stair-stepped shape. For example, the insulation patterns 102a and the conductive patterns 104a may have increasingly shorter lengths as the distance in the third direction increases between the insulation patterns 102a and the conductive patterns 104a and the substrate 100. Each of the conductive patterns 104a may include a pad region corresponding to an upper surface of each stair. A pad conductive pattern 112a and 112b may be disposed to contact a portion of an upper surface of respective pad regions. A mask pattern 116a may be disposed to cover an upper surface of the pad conductive pattern 112a and 112b.

A contact plug 134 may be disposed to penetrate the mask pattern 116a to contact the pad conductive pattern 112a and 112b. The contact plug 134 may be electrically connected to each of the conductive patterns 104a. The vertical semiconductor device may further include one or more spacers 110 covering a sidewall of the stair-stepped portion (or an edge portion) of the conductive pattern structure 106a and a channel structure 128 penetrating the conductive pattern structure 106a. As used herein, items described as being "electrically connected" are configured such that an electrical signal can be passed from one item to the other. The term "contact," as used herein, refers to a direct connection (i.e., touching) unless the context indicates otherwise.

The substrate 100 may be a semiconductor substrate, e.g., a silicon substrate, a germanium substrate, or a silicon-germanium substrate.

The conductive pattern structure 106a may extend lengthwise in a first direction parallel to the upper surface of the substrate 100. A plurality of conductive pattern structures 106a may be arranged spaced apart from each other in the second direction perpendicular to the first direction and parallel to the upper surface of the substrate 100. An opening 136 may be disposed between the conductive pattern structures 106a. Since cell blocks are divided by the opening 136, the opening 136 may be disposed in cell block units. An item, layer, or portion of an item or layer described as extending "lengthwise" in a particular direction has a length in the particular direction and a width perpendicular to that direction, where the length is greater than the width.

Each of the conductive patterns 104a may include a portion that is non-overlapped with other conductive patterns 104a. The non-overlapped portions of the conductive patterns 104a may be provided as pad regions. The pad regions may be positioned at different levels.

In some embodiments, the conductive pattern structures 106a may have a stair-stepped shape in the first direction as well as in the second direction. In the conductive pattern structure 106a, a plurality of conductive patterns 104a may be included in one stair in the first direction. For example, each stair of the conductive pattern structure 106a may include more than one conductive pattern 104a. The number of stacks of the conductive patterns 104a in one stair in the first direction may be equal to the number of stairs in the second direction. As shown in the drawings, two conductive patterns 104a may be included in one stair in the first direction, and, in this case, two stairs may be formed in the second direction. In such embodiments, the lowest stair in the second direction may include only a single conductive pattern 104a.

In some embodiments, the conductive patterns 104a may include polysilicon. In some embodiments, the conductive patterns 104a may include metal capable of being easily removed by a dry etch. For example, the conductive patterns 104a may include titanium, titanium nitride, tantalum, or tantalum nitride.

In some embodiments, the conductive patterns 104a may include a ground selection line (GSL), a string selection line (SSL), and word lines between the GSL and SSL.

The spacer 110 may include a first spacer 110a and a second spacer 110b.

Referring to FIGS. 3 and 4, the first spacer 110a may be disposed on a wall of an upper stair contacting the pad region corresponding to an upper surface of an uppermost stair in the second direction. For example, the first spacer 110a may be disposed on a wall of the stair in the first direction. The first spacer 110a may extend lengthwise in the second direction.

The second spacer 110b may be disposed on walls of upper stairs contacting the pad region corresponding to an upper surface of the stair below the uppermost stair in the second direction. The second spacer 110b may be disposed on the wall of the stair in the first direction and on the wall of the stair in the second direction, respectively. Referring to FIG. 3, the second spacer 110b may include a first portion extending lengthwise in the second direction and a second portion extending lengthwise in the first direction from an end of the first portion. The second spacer 110b may have a bent shape at a portion where the first portion and the second portion meet, in plan view. For example, the intersection of the first and second portions may form a right angle.

The pad conductive pattern 112a and 112b may be disposed to contact an upper surface of an end portion or edge portion of the corresponding conductive patterns 104a. The pad conductive pattern 112a and 112b may be spaced apart from the wall of the upper stair contacting the corresponding pad region. For example, the pad conductive pattern 112a and 112b may be spaced apart and electrically isolated from sidewalls of adjacent upper and lower stairs, such that the lower surface of the pad conductive pattern 112a and 112b may only contact the edge portion of the corresponding conductive patterns 104a and sidewalls of the pad conductive pattern 112a and 112b may not contact sidewalls of adjacent conductive patterns 104a. When viewed in plan view, the pad conductive pattern 112a and 112b may not extend beyond the edges of the corresponding conductive patterns 104a in the first and second directions.

In some embodiments, the pad conductive pattern 112a and 112b may include polysilicon. In some embodiments, the pad conductive pattern 112a and 112b may include metal capable of being easily removed by a dry etch. For example, pad conductive pattern 112a and 112b may include titanium, titanium nitride, tantalum, or tantalum nitride.

In some embodiments, the pad conductive pattern 112a and 112b may include the same material as the conductive patterns 104a. In some embodiments, the pad conductive pattern 112a and 112b may include a material different from the conductive patterns 104a.

As an example, the conductive patterns 104a and the pad conductive pattern 112a and 112b may include polysilicon. As another example, the conductive patterns 104a may include polysilicon, and the pad conductive pattern 112a and 112b may include titanium, titanium nitride, tantalum, tantalum nitride, or tungsten.

In some embodiments, the pad conductive pattern 112a and 112b may be disposed spaced apart from the spacer 110. For example, the pad conductive pattern 112a and 112b may be spaced apart from spacers 110 in the first and second directions.

The pad conductive pattern 112a and 112b may include a first pad conductive pattern 112a disposed remotely from the first spacer 110a and a second pad conductive pattern 112b disposed remotely from the second spacer 110b. The corresponding conductive patterns 104a may be exposed between the first pad conductive pattern 112a and the first spacer 110a and between the second pad conductive pattern 112b and the second spacer 110b. When viewed in plan view, a shape of an upper surface of the conductive pattern 104a exposed between the first pad conductive pattern 112a and the first spacer 110a and a shape of an upper surface of the conductive pattern 104a exposed between the second pad conductive pattern 112b and the second spacer 110b may be different from each other. The upper surface of the conductive pattern 104a exposed between the first pad conductive pattern 112a and the first spacer 110a may have a shape extending lengthwise in the second direction. The upper surface of the conductive pattern 104a exposed between the second pad conductive pattern 112b and the second spacer 110b may have a bent shape and include a portion extending lengthwise in the first direction and a portion extending lengthwise in the second direction. For example, the upper surface of the conductive pattern 104a exposed between the second pad conductive pattern 112b and the second spacer 110b may have first and second portions that form a right angle with one another.

In some embodiments, an area of the upper surface of the first pad conductive pattern 112a may be equal to an area of the upper surface of the second pad conductive pattern 112b. In this case, an area of an upper surface of the pad region below the second pad conductive pattern 112b may be greater than an area of an upper surface of the pad region below the first pad conductive pattern 112a. In some embodiments, the area of the first pad conductive pattern 112a may be different from the area of the upper surface of the second pad conductive pattern 112b. In either case, the area of the upper surface of the pad region below the first pad conductive pattern 112a and the area of the upper surface of the pad region below the second pad conductive pattern 112b may be larger than the area of their corresponding first and second pad conductive patterns 112a and 112b.

In some embodiments, a thickness of each of the first and second pad conductive patterns 112a and 112b may be greater than a thickness of each conductive pattern 104a and may be smaller than a height of one stair in the first direction of the conductive pattern structure 106a. For example, the thickness of the each of the first and second pad conductive patterns 112a and 112b may be greater than 0.5 times the thickness of each conductive pattern 104a. In some embodiments, the height of one stair in the first direction may be the combined heights of two insulation patterns 102a stacked with two conductive patterns 104a.

The mask pattern 116a may be disposed on the pad conductive pattern 112a and 112b and may cover the upper surface of the pad conductive pattern 112a and 112b. In some embodiments, the mask pattern 116a may include a material having a high etch selectivity with respect to the pad conductive pattern 112a and 112b, the conductive patterns 104a, and the insulation patterns 102a. The mask pattern 116a may include nitride, e.g., silicon nitride. In this case, the mask pattern 116a may serve as an etch stop pattern.

In some embodiments, the mask pattern 116a may include, e.g., silicon oxide.

An upper pad conductive pattern 113a and the mask pattern 116a may be disposed on an uppermost one of the insulation patterns 102a of the conductive pattern structure 106a. For example, the upper pad conductive pattern 113a may be formed on the entire upper surface of the uppermost insulation patterns 102a, and the mask pattern 116a may be formed on the upper pad conductive pattern 113a. The upper pad conductive pattern 113a may be provided as a dummy conductive pattern that is not substantially used in an operation.

A shape of the mask pattern 116a and shapes of the first and second pad conductive patterns 112a and 112b may be changed depending on an etch process.

For example, as shown in FIG. 1, the mask pattern 116a may not cover an upper portion of the spacer 110. In this case, the pad conductive pattern 112a and 112b and the mask pattern 116a may be disposed on only the conductive pattern 104a.

In some embodiments, as shown in FIG. 2A, the mask pattern 116a may cover a portion of the upper portion of the spacer 110. For example, the pad conductive pattern 112a and 112b and the mask pattern 116a may be formed on the upper surface of the conductive pattern 104a and an upper surface of the spacer 110.

In some embodiments, as shown in FIG. 2A, the conductive pattern 104a between the pad conductive pattern 112a and 112b and the spacer 110 may be exposed. In other embodiments, as shown in FIG. 2B, a thickness (in the vertical or third direction) of the conductive pattern 104a between the pad conductive pattern 112a and 112b and the spacer 110 may be decreased. In further embodiments, as shown in FIG. 2C, a portion of the pad conductive pattern 112a and 112b may be left between the pad conductive pattern 112a and 112b and the spacer 110, and the conductive pattern 104a between the pad conductive pattern 112a and 112b and the spacer 110 may not be exposed.

A first upper interlayer insulation layer 120 may be disposed to cover the conductive pattern structure 106a. For example, the first upper interlayer insulation layer 120 may be disposed to cover top and side surfaces of the conductive pattern structure 106a, top and side surfaces of the spacers 110, side surfaces of the upper pad conductive layer 113, and top and side surfaces of the mask pattern 116a. An upper surface of the first upper interlayer insulation layer 120 may be planar. The first upper interlayer insulation layer 120 may include, e.g., silicon oxide. As used herein, the term "planar" may refer to a surface that is flat and formed along a single plane. The upper surface of the first upper interlayer insulation layer 120 may be parallel to an upper surface of the substrate 100.

A channel structure 128 may be disposed to penetrate the first upper interlayer insulation layer 120 and the conductive pattern structure 106a to be electrically connected to the substrate 100. For example, the channel structure 128 may be disposed to penetrate the first upper interlayer insulation layer 120, the mask pattern 116a, the upper pad conductive pattern 113a, and the alternately stacked insulation patterns 102a and conductive patterns 104a. The channel structure 128 may be disposed in a portion where the stairs are not formed in the conductive pattern structure 106a.

In some embodiments, a semiconductor pattern 122 may be disposed between the substrate 100 and the channel structure 128. The semiconductor pattern 122 may include, e.g., monocrystalline silicon or polysilicon. A lower surface of the semiconductor pattern 122 may be in contact with the substrate 100.

The channel structure 128 may include a dielectric structure 124a, a channel 124b, and a buried insulation pattern 124c, and an upper conductive pattern 126. The channel 124b may have a hollow cylinder shape or a cup shape. The channel 124b may include polysilicon or monocrystalline silicon. The buried insulation pattern 124c may fill the inside of the channel 124b. The dielectric structure 124a may have a shape covering an outer sidewall of the channel 124b. Although not illustrated in FIG. 1, the dielectric structure 124a may include a tunnel insulation layer, a charge storage layer, and a blocking layer that are sequentially stacked from the outer sidewall of the channel 124b toward the conductive pattern 104a. The upper conductive pattern 126 may be disposed on the dielectric structure 124a, the channel 124b, and the buried insulation pattern 124c.

A second upper interlayer insulation layer 130 may be disposed on the first upper interlayer insulation layer 120. The second upper interlayer insulation layer 130 and the first upper interlayer insulation layer 120 may be collectively referred to as interlayer insulation layer 132. In some embodiments, the first and second upper interlayer insulation layers 120 and 130 may be provided as one interlayer insulation layer.

The contact plugs 134 may be disposed to penetrate the first and second upper interlayer insulation layers 120 and 130 and the mask pattern 116a to contact the upper surface of the pad conductive pattern 112a and 112b. In some embodiments, the contact plugs 134 may be disposed on each level of the pad conductive pattern 112a and 112b. For example, contact plugs 134 may be disposed to contact the upper surfaces of the pad conductive pattern 112a and 112b at each step of the stair-stepped conductive pattern structure 106a. In some embodiments, the contact plug 134 may include a barrier metal pattern and a metal pattern.

A lower surface of the contact plug 134 may be disposed on or in the upper surface of the pad conductive pattern 112a and 112b (e.g., on or in an upper surface of a combination structure of the pad conductive pattern 112a and 112b and the conductive pattern 104a thereunder). Thus, a height (in the third direction) of a region where the lower surface of the contact plug 134 is positioned may be increased with respect to the upper surface of the substrate 100 and, thus a height (in the third direction) of the contact plug 134 may be decreased. Accordingly, a process margin may be increased, such that a contact failure of the contact plug 134 may be reduced.

In addition, the contact plug 134 may penetrate the mask pattern 116a. As the mask pattern 116a is provided as the etch stop layer, the lower surface of the contact plug 134 may be easily formed on the pad conductive pattern 112a and 112b. Therefore, the contact failure of the contact plug 134 may be reduced.

A wiring line (not illustrated) may be disposed on the second upper interlayer insulation layer 130 to be electrically connected to an upper surface of the contact plug 134. The wiring line may extend in the second direction.

FIGS. 5 to 18 are cross-sectional view, plan views, and perspective views illustrating a method of manufacturing a vertical semiconductor device according to example embodiments. FIGS. 5, 7, 8, 11 to 14, 16, and 18 are cross-sectional views. FIGS. 10, 15, and 17 are plan views. FIGS. 6 and 9 are perspective views.

Figure 5:
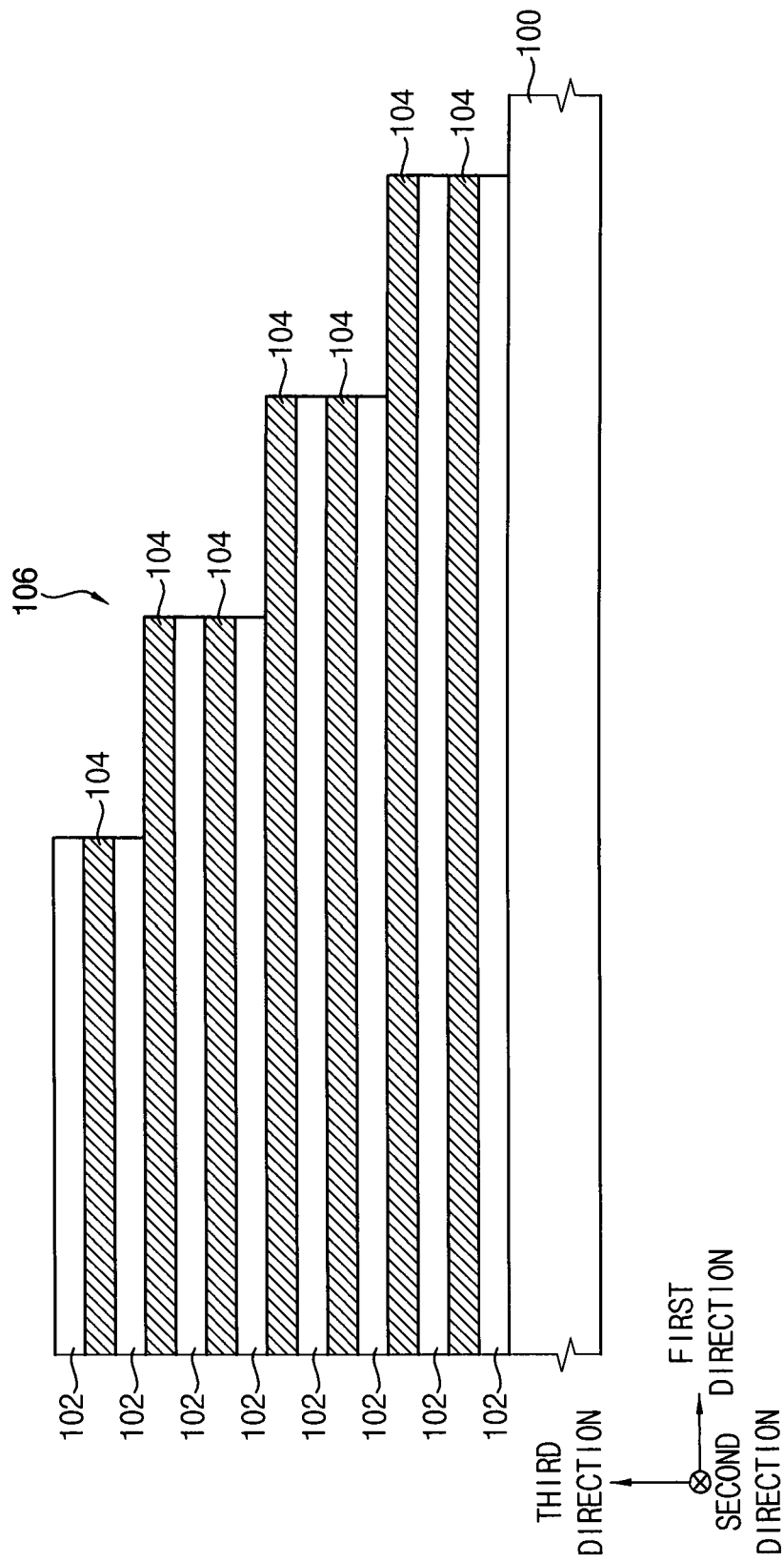
FIGS. 5 to 18 are cross-sectional view, plan views, and perspective views illustrating a method of manufacturing a vertical semiconductor device according to example embodiments.
Figure 6:
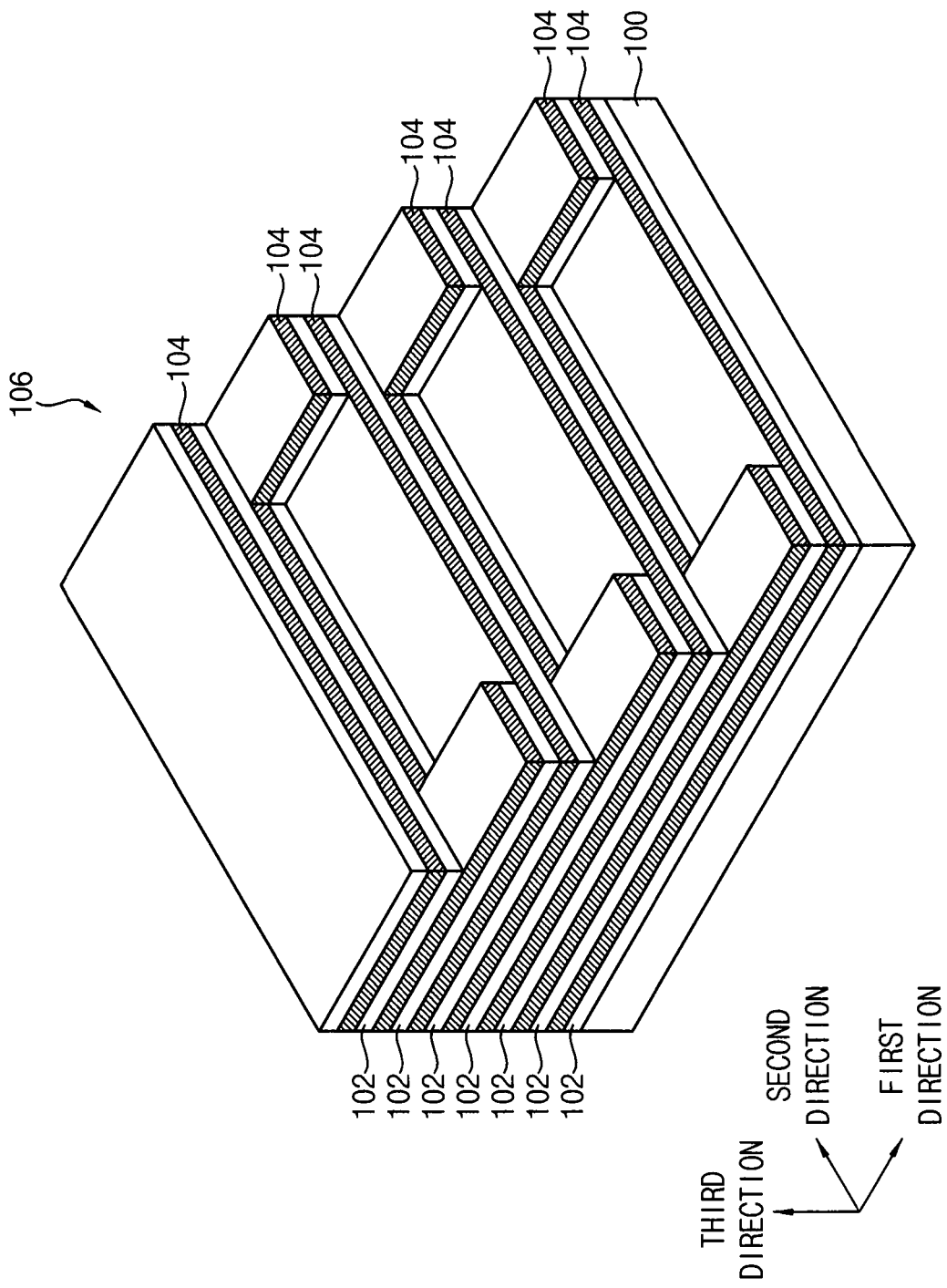

Referring to FIGS. 5 and 6, a preliminary conductive pattern structure 106, in which insulation layers 102 and conductive layers 104 are alternately stacked on the substrate 100, may be formed to have a stair-stepped shape at an edge portion thereof. For example, the insulation layers 102 and the conductive layers 104 may have increasingly shorter lengths as the distance in the third direction increases between the insulation layers 102 and the conductive layers 104 and the substrate 100. Upper surfaces of the conductive layers 104 may be exposed at the edge portion of the preliminary conductive pattern structure 106. The insulation layer 102 may be formed at an uppermost layer of the preliminary conductive pattern structure 106. For example, each of the lowermost and uppermost layers of the preliminary conductive pattern structure 106 may be insulation layer 102.

Specifically, the insulation layers 102 and the conductive layers 104 may be alternately and repeatedly stacked on the substrate 100. In some embodiments, the insulation layers 102 may be formed of silicon oxide or an oxide based material, such as, silicon oxycarbide or silicon oxyfluoride. In some embodiments, the conductive layers 104 may be formed of polysilicon. In some embodiments, the conductive layers 104 may be formed of metal capable of being easily removed by a dry etch. For example, the conductive layers 104 may include titanium, titanium nitride, tantalum, or tantalum nitride.

Portions of the insulation layers 102 and the conductive layers 104 may be stepwise etched, such that the preliminary conductive pattern structure 106 may be formed to the stair-stepped shape at the edge portion thereof. In some embodiments, the preliminary conductive pattern structure 106 may be formed to have a stair-stepped shape in the first direction and in the second direction.

For example, to form the preliminary conductive pattern structure 106, portions of the conductive layers 104 and the insulation layers 102 may be etched, such that a separation trench may be formed to form stairs in the second direction. Thereafter, portions of the conductive layers 104 and the insulation layers 102 may be sequentially etched to form stairs in the first direction. Thus, the conductive layers 104 and insulation layers 102 may have a stair-stepped shape in the first direction and in the second direction by the separation trench.

As another example, to form the preliminary conductive pattern structure 106, portions of the conductive layers 104 and the insulation layers 102 may be etched to have a stair-stepped shape in the first direction. Thereafter, portions of the conductive layers 104 and the insulation layers 102 exposed at each stair formed in the first direction may be etched to have a stair-stepped shape in the second direction.

In the preliminary conductive pattern structure 106, an upper surface of each of the conductive layers 104 exposed at each stair may be provided as a preliminary pad region. The preliminary pad region may be provided as a pad region of a conductive pattern included in the memory cell through the following process.

In some embodiments, as shown in the drawings, two conductive layers 104 may be included in the stair formed in the first direction, in the preliminary conductive pattern structure 106. In this case, two stairs may be formed in the second direction. When the number of the stairs formed in the second direction increases, the number of the conductive layers 104 included in one stair in the first direction may increase. However, the number of the stairs formed in each of the first and second directions are not limited.

In some embodiments, as shown in the drawings, one conductive layer 104 may be included in one stair in the first direction at the uppermost portion of the preliminary conductive pattern structure 106.

Figure 7:
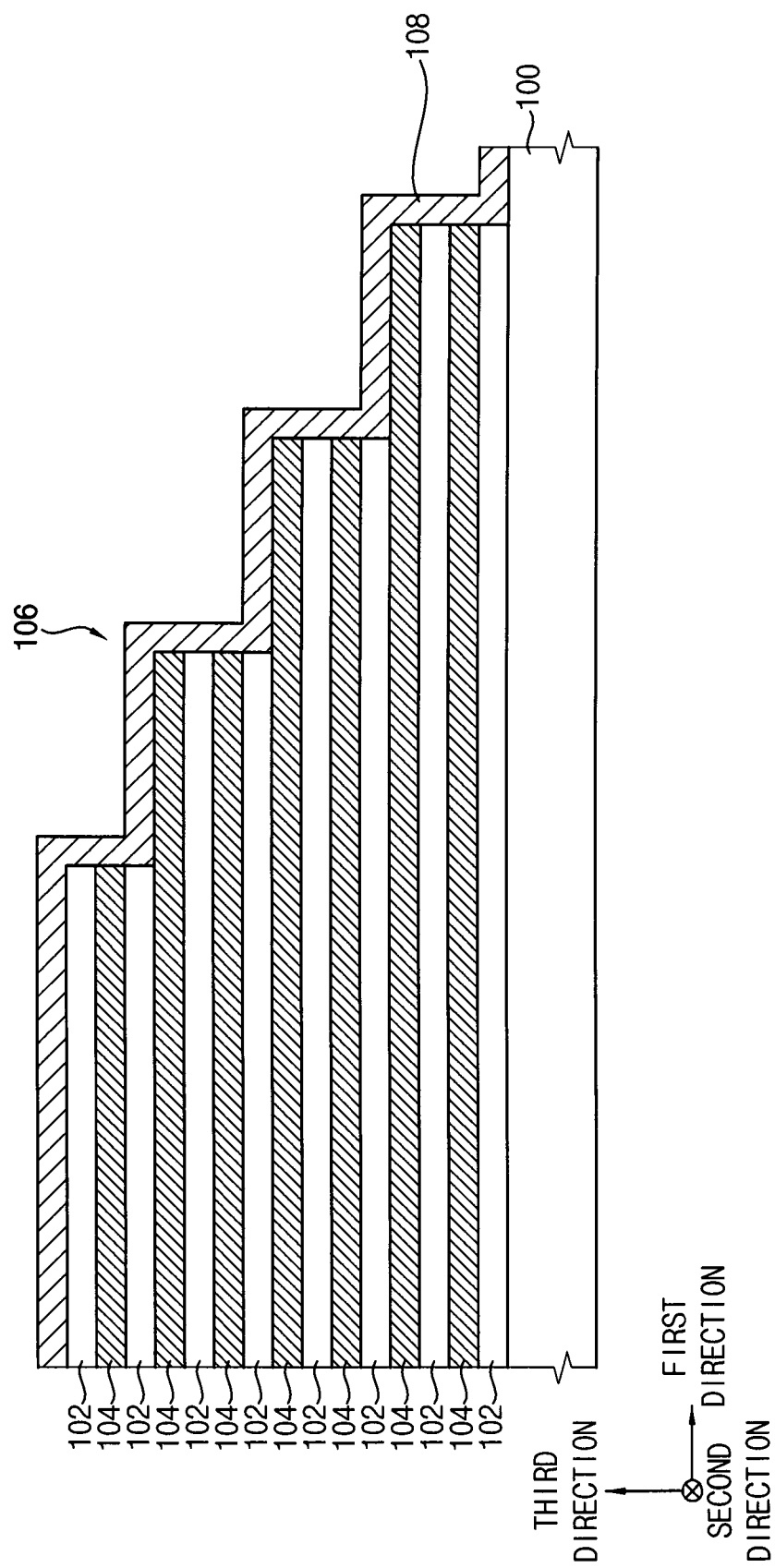

Referring to FIG. 7, a spacer layer 108 may be formed to cover an upper surface and sidewalls of the preliminary conductive pattern structure 106.

The spacer layer 108 may be formed of a material having an etch selectivity with respect to the conductive layers 104. In some embodiments, the spacer layer 108 may be formed of nitride, e.g., silicon nitride. In some embodiments, the spacer layer 108 may include silicon oxide.

Figure 8:
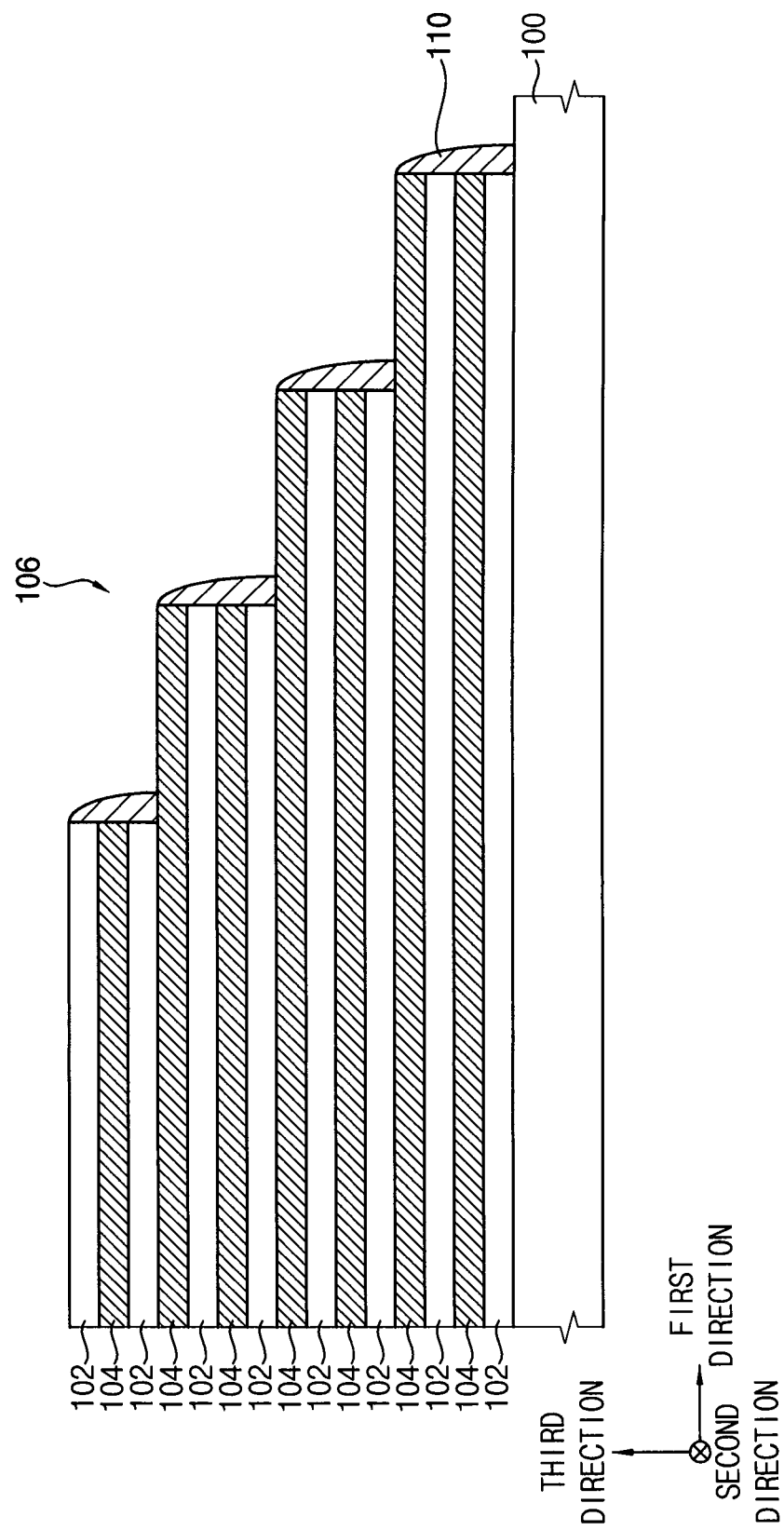
Figure 9:
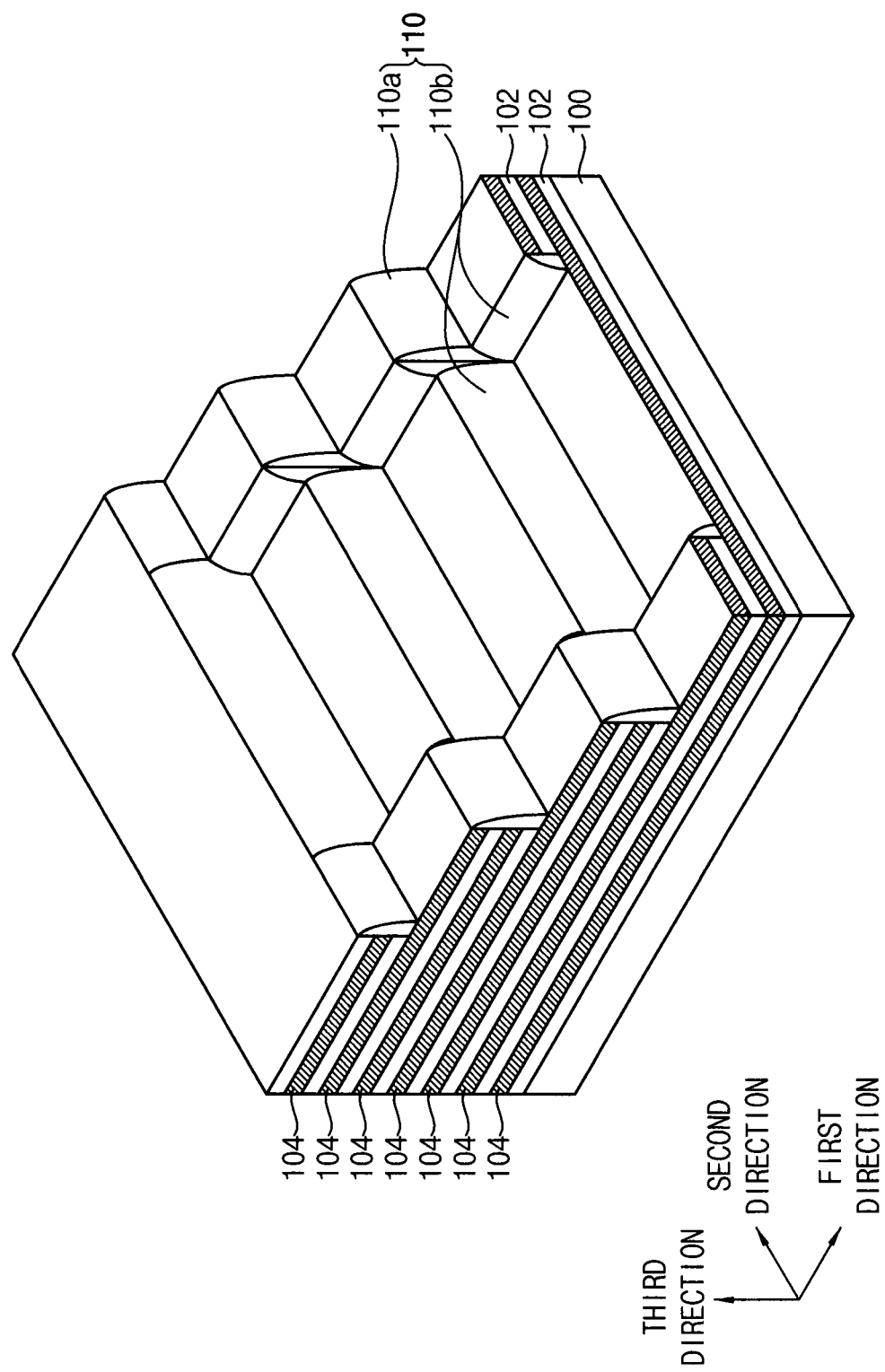
Figure 10:
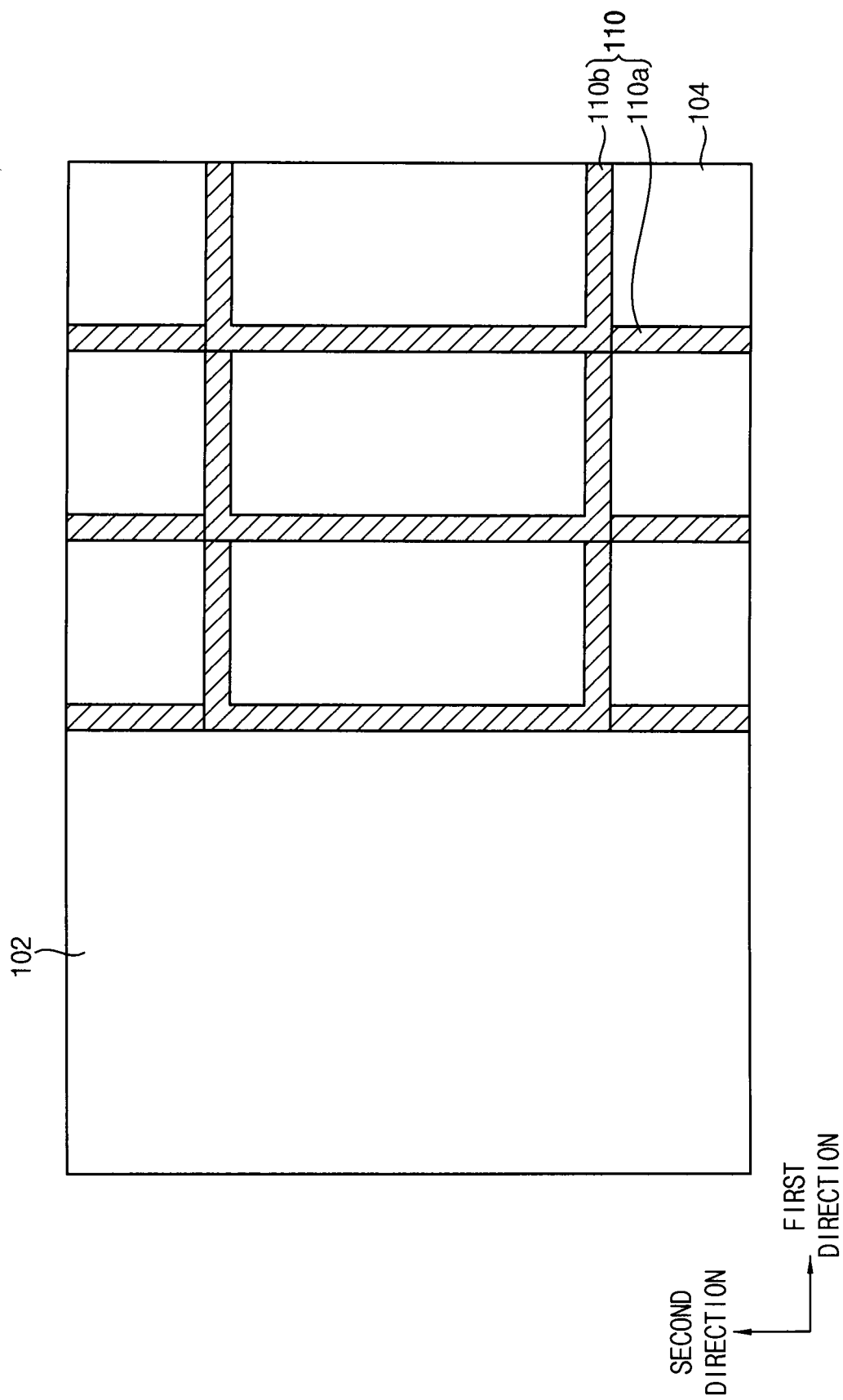

Referring to FIGS. 8 to 10, the spacer layer 108 may be anisotropically etched to form a spacer 110 covering the sidewall of the preliminary conductive pattern structure 106.

The spacer 110 may be formed on a wall of each stair of the stair-stepped portion (or an edge portion) of the preliminary conductive pattern structure 106 to cover portions of the conductive layer 104 and the insulation layer 102 corresponding to the wall of each stair. In addition, the conductive layer 104 corresponding to an upper surface of each stair of the preliminary conductive pattern structure 106 adjacent to the spacer 110 may be exposed. In some embodiments, a portion of the upper surface of the conductive layer 104 may be covered by the spacer 110.

The spacer 110 may include the first spacer 110a and the second spacer 110b.

The first spacer 110a may be formed on a wall of an upper stair contacting the preliminary pad region corresponding to an upper surface of an uppermost stair in the second direction. For example, the first spacer 110a may be disposed on the wall of the stair in the first direction.

The second spacer 110b may be formed on walls of upper stairs contacting the preliminary pad region corresponding to an upper surface of the stair below the uppermost stair in the second direction. The second spacer 110b may be disposed on the wall of the stair in the first direction and on the wall of the stair in the second direction, respectively.

In plan view, the first spacer 110a may be formed to extend lengthwise along the second direction, and the second spacer 110b may include a first portion extending lengthwise in the second direction and a second portion bent in the first direction from an end of the first portion and extending lengthwise in the first direction.

Figure 11:
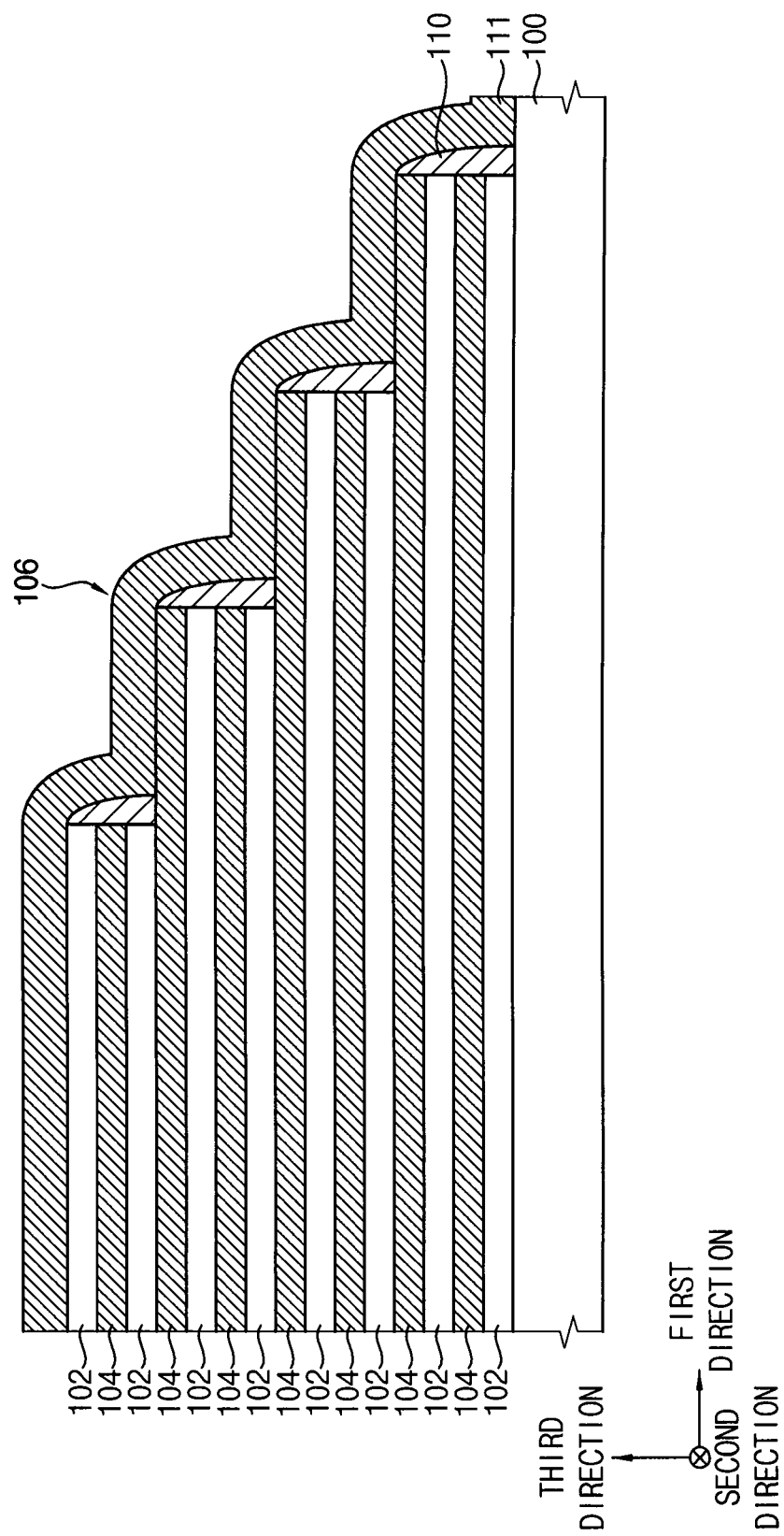

Referring to FIG. 11, a pad conductive layer 111 may be formed to cover the preliminary conductive pattern structure 106 and the spacers 110. The pad conductive layer 111 may be formed along surface profiles of the preliminary conductive pattern structure 106 and the spacers 110.

In some embodiments, the pad conductive layer 111 may be formed of polysilicon. In some embodiments, the pad conductive layers 111 may be formed of a material capable of being easily removed by a dry etch. For example, the pad conductive layers 111 may include titanium, titanium nitride, tantalum, or tantalum nitride.

In some embodiments, the pad conductive layer 111 may include the same material as the conductive layers 104. In some embodiments, the pad conductive layer 111 may include a material different from the conductive layers 104.

The pad conductive layer 111 may be provided as a pad conductive pattern through the following process. When the pad conductive layer 111 is thin, the contact margin may be decreased due to the thin pad conductive layer 111. When the pad conductive layer 111 is thick, it may be difficult to adjust a removal thickness of the pad conductive layer 111. In some embodiments, the pad conductive layer 111 may be thicker than the thickness of the conductive layer 104 and may be thinner than a height of one stair in the first direction. For example, the thickness of the pad conductive layer 111 may be greater than 0.5 times the thickness of the conductive layer 104. In some embodiments, the height of one stair in the first direction may be the combined heights of two insulation layers 102 stacked with two conductive layers 104.

Figure 12:
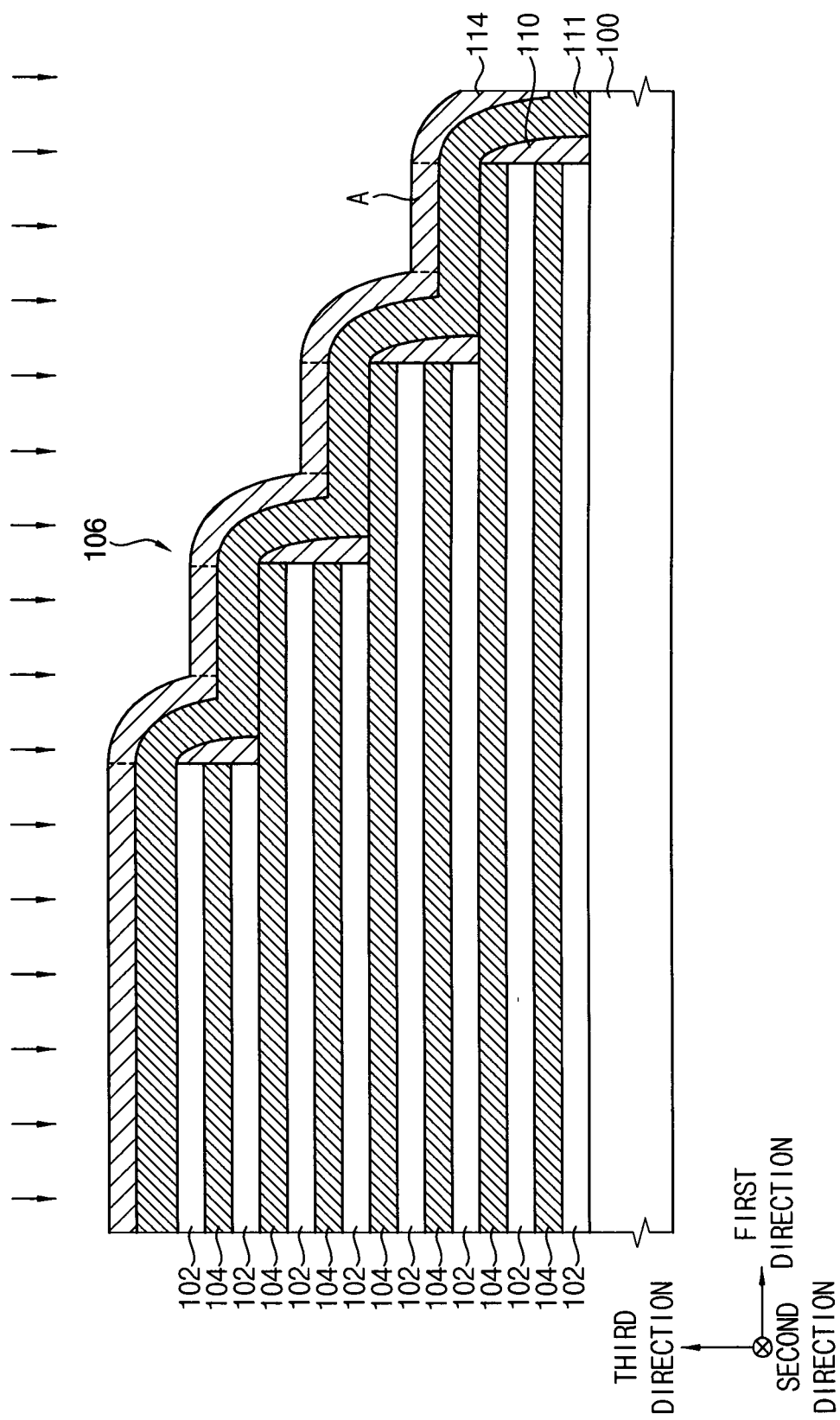

Referring to FIG. 12, a preliminary mask layer may be formed on the pad conductive layer 111. A planar upper surface A of the preliminary mask layer may be selectively hardened to form a mask layer 114. The mask layer 114 may be conformally formed along a surface profile of the pad conductive layer 111.

The mask layer 114 may be formed of an insulating material having a high etch selectivity with respect to the pad conductive layer 111.

In some embodiments, the mask layer 114 may be formed of nitride, e.g., silicon nitride. When the mask layer 114 includes nitride, the mask layer 114 may have a high etch selectivity with respect to silicon oxide. Thus, the mask layer 114 may serve as an etch stop layer in the following process of forming a contact hole.

In some embodiments, the preliminary mask layer may include silicon nitride containing hydrogen. The process of selectively hardening the surface of the preliminary mask layer may include, e.g., a plasma treatment process. When the plasma treatment process is performed, the planar upper surface A of the preliminary mask layer may be plasma treated. When the plasma treatment process is performed, the planar upper surface A of the preliminary mask layer may be plasma treated, but the preliminary mask layer on the spacer 110 may not be plasma treated. By the plasma treatment, hydrogen contained in silicon nitride in the planar upper surface A of the preliminary mask layer may be removed, thereby hardening the preliminary mask layer. However, relatively large amount of hydrogen may be contained in silicon nitride in the surface of the preliminary mask layer on the spacer 110. For example, the surface of the preliminary mask layer on the spacer 110 may not be hardened. The preliminary mask layer on the spacer 110 may be located between adjacent planar upper surfaces A. The preliminary mask layer on the spacer 110 may include both horizontal and vertical components, whereas the planar upper surfaces A may have only horizontal components.

In some embodiments, the mask layer 114 may include silicon oxide. In this case, silicon oxide in the planar upper surface A of the preliminary mask layer may be hardened by the plasma treatment process to form the mask layer 114.

Figure 13:
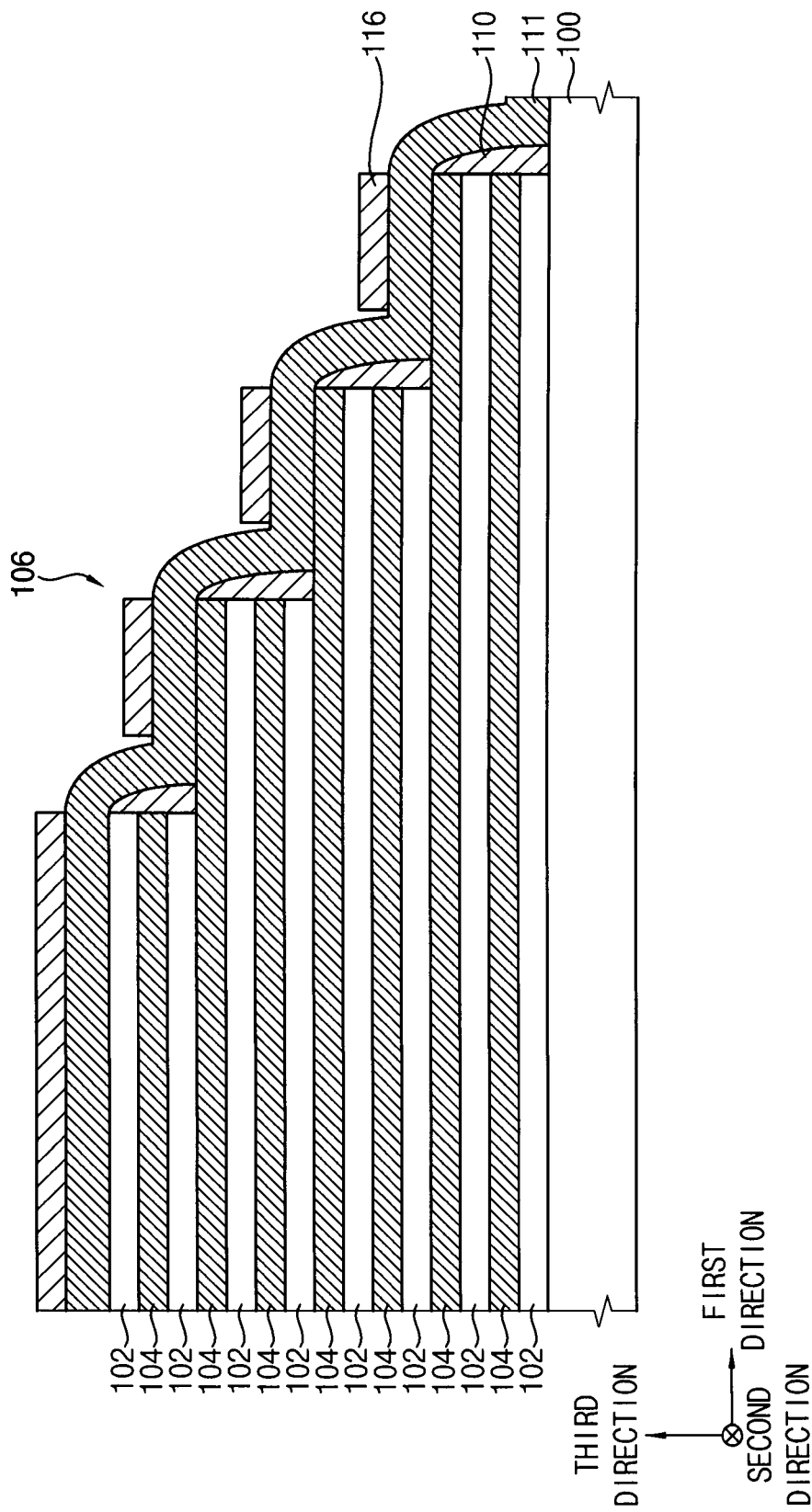

Referring to FIG. 13, the unhardened portion of the mask layer 114 may be etched to form a preliminary mask pattern 116. By the etch process, the portion of mask layer 114 containing hydrogen may have a relatively high etch rate. In the etch process, a portion of the mask layer 114 on the pad conductive layer 111 that is positioned on the spacer 110 may be etched.

In some embodiments, the preliminary mask pattern 116 may have a shape that covers the planar upper surface of the pad conductive layer 111. A portion of the pad conductive layer 111 on the spacer 110 may be exposed.

Figure 14:
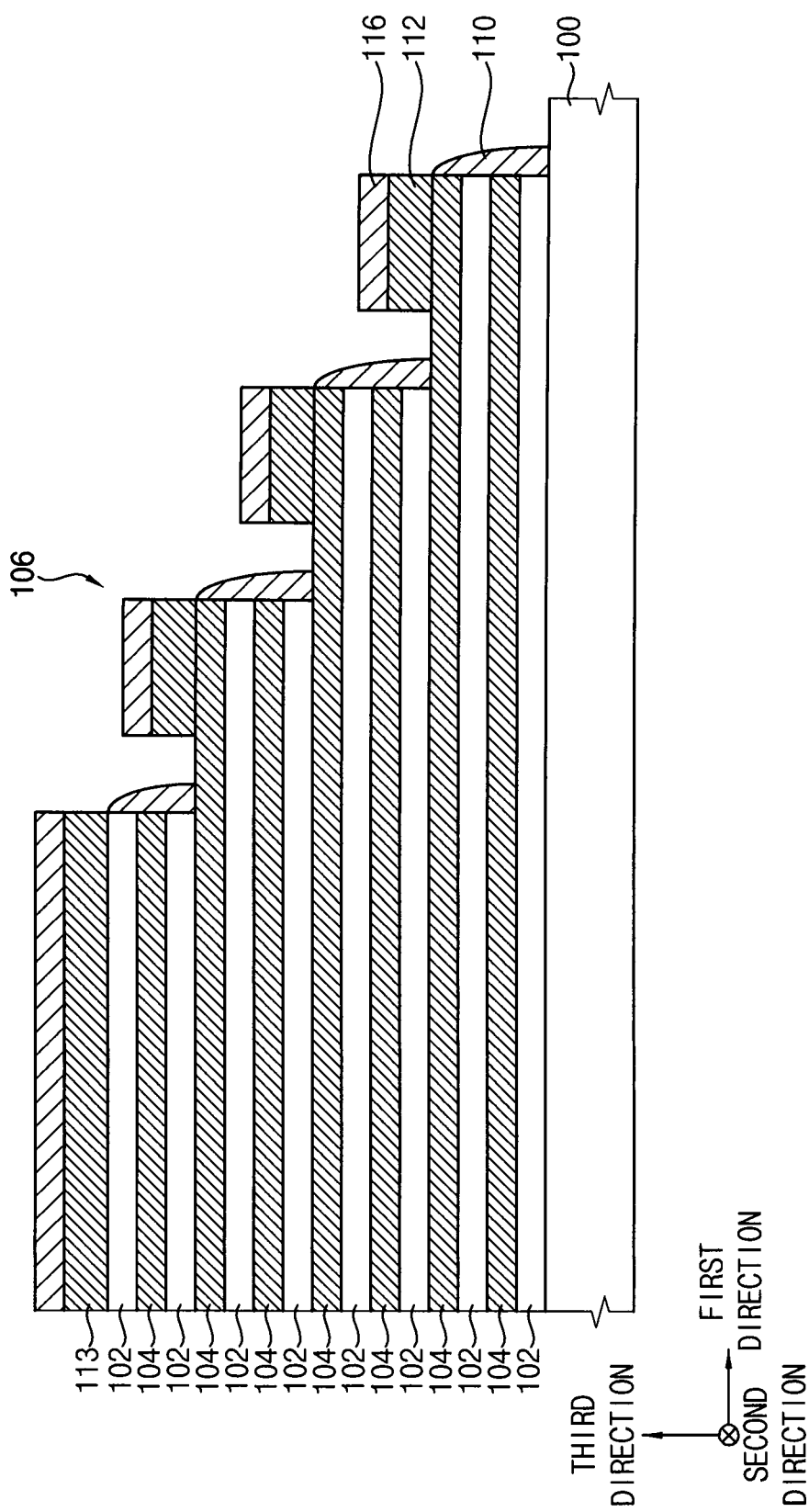
Figure 15:
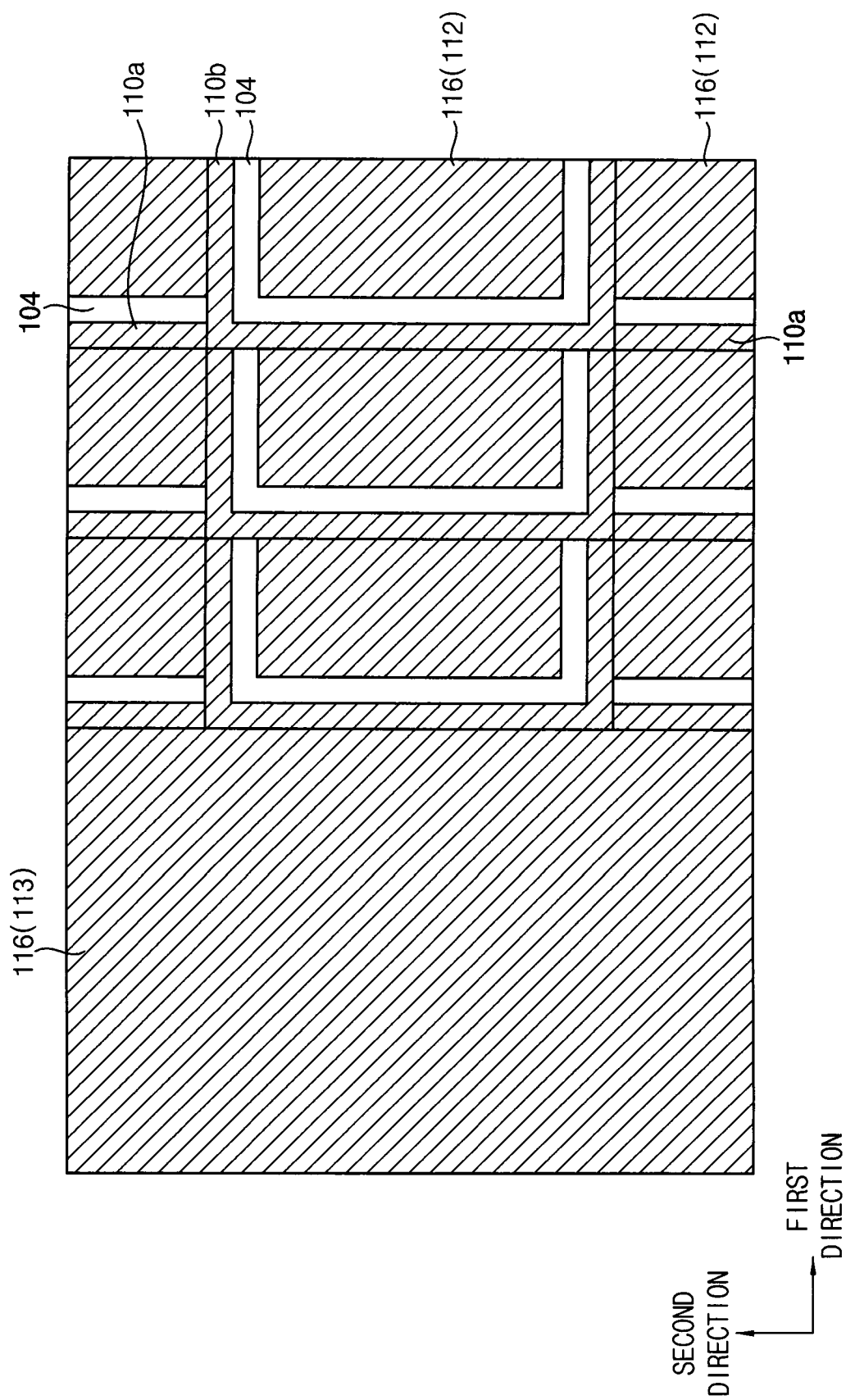

Referring to FIGS. 14 and 15, the exposed portion of the pad conductive layer 111 may be etched using the preliminary mask pattern 116 as an etch mask, such that the pad conductive layer 111 may be separated into respective layers. Thus, a preliminary pad conductive pattern 112 may be formed on each conductive layer 104 corresponding to an upper surface of each stair.

In the etch process, at least a portion of the pad conductive layer 111 on the spacer 110 may be removed. In addition, the conductive layer 104 below the pad conductive layer 111 may not be removed in the etch process.

In some embodiments, the preliminary pad conductive pattern 112 may be formed on an upper surface of an edge portion of the conductive layer 104.

In some embodiments, the pad conductive layer 111 on the spacer 110 may be removed to from the preliminary pad conductive pattern 112. Thus, the preliminary pad conductive pattern 112 may be disposed at a distance from the spacer 110.

As shown in FIG. 15, the preliminary pad conductive pattern 112 may include a first portion disposed remotely from the first spacer 110a and a second portion disposed remotely from the second spacer 110b.

An upper pad conductive layer 113 and the preliminary mask pattern 116 formed on an uppermost portion of the preliminary conductive pattern structure 106 may not be removed in the etch process. Thus, the upper pad conductive layer 113 and the preliminary mask pattern 116 may cover the uppermost insulation layer 102 of the preliminary conductive pattern structure 106. The upper pad conductive layer 113 may be provided as a dummy conductive pattern through the following process.

A shape of a pad conductive pattern to be formed in the following process may be changed depending on a shape of the preliminary mask pattern 116 and an etch extent of the pad conductive layer 111.

For example, the preliminary mask pattern 116 may not cover the spacer 110. In this case, as shown in FIG. 1, the pad conductive pattern 112a and the mask pattern 116a may be formed on only the conductive pattern 104a. For example, in the case in which the preliminary mask pattern 116 covers the upper portion of the spacer 110, the pad conductive pattern 112a and the mask pattern 116a may be formed on the upper surface of the conductive pattern 104a and the upper surface of the spacer 110 as shown in FIGS. 2A to 2C.

For example, in the process of etching the pad conductive layer 111, the conductive layer 104 may be exposed between the preliminary pad conductive pattern 112 and the spacer 110. In some embodiments, in the process of etching the pad conductive layer 111, a portion of the conductive layer 104 between the preliminary pad conductive pattern 112 and the spacer 110 may be removed, such that a portion of the conductive pattern 104a may be thinned as shown in FIG. 2B. In other embodiments, according to the process of etching the pad conductive layer 111, a portion of the pad conductive layer 111 may remain between the preliminary pad conductive pattern 112 and the spacer 110, such that a thin protrusion portion of the pad conductive pattern 112a may contact the spacer 110, as shown in FIG. 2C.

Figure 16:
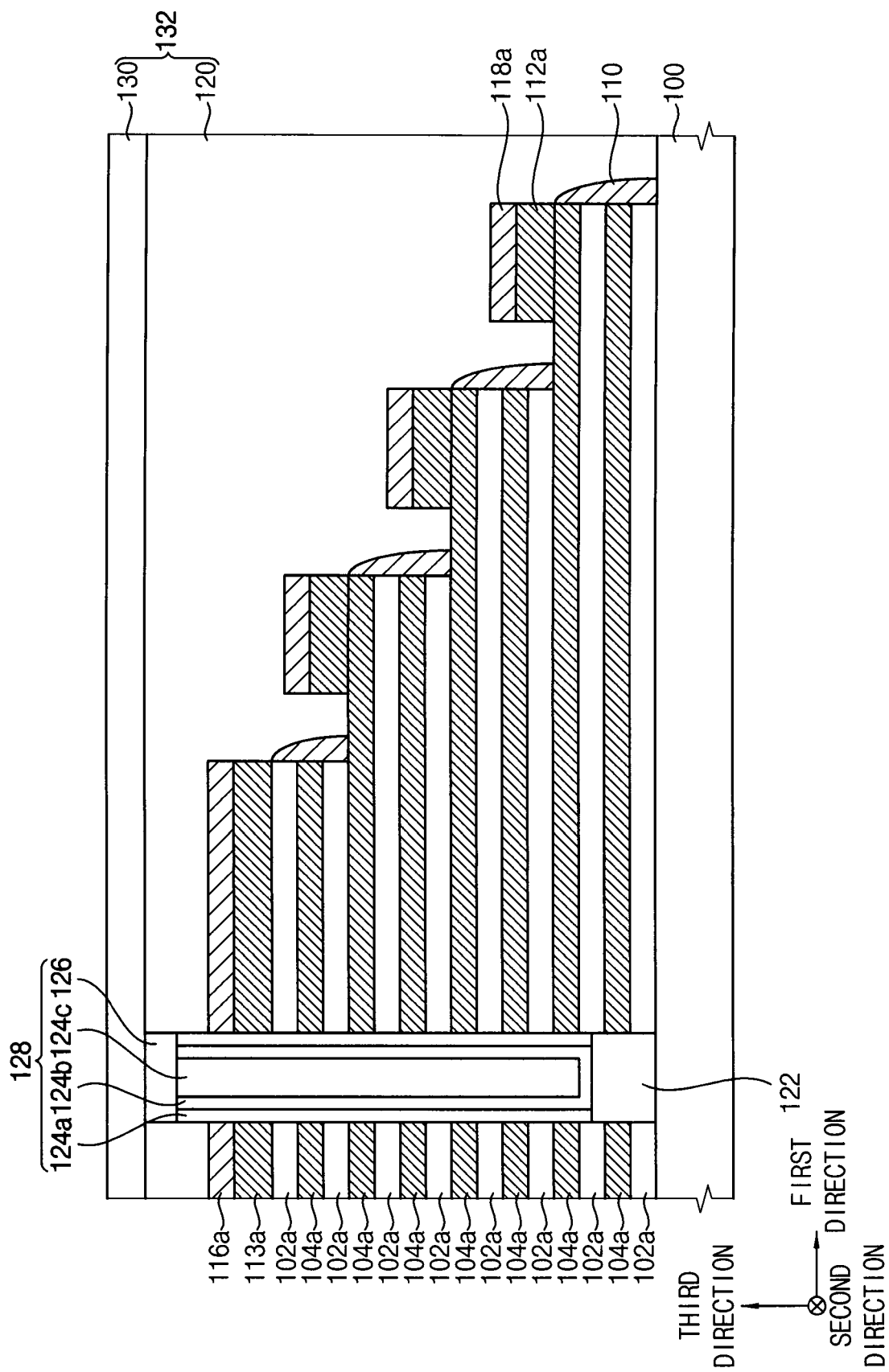
Figure 17:
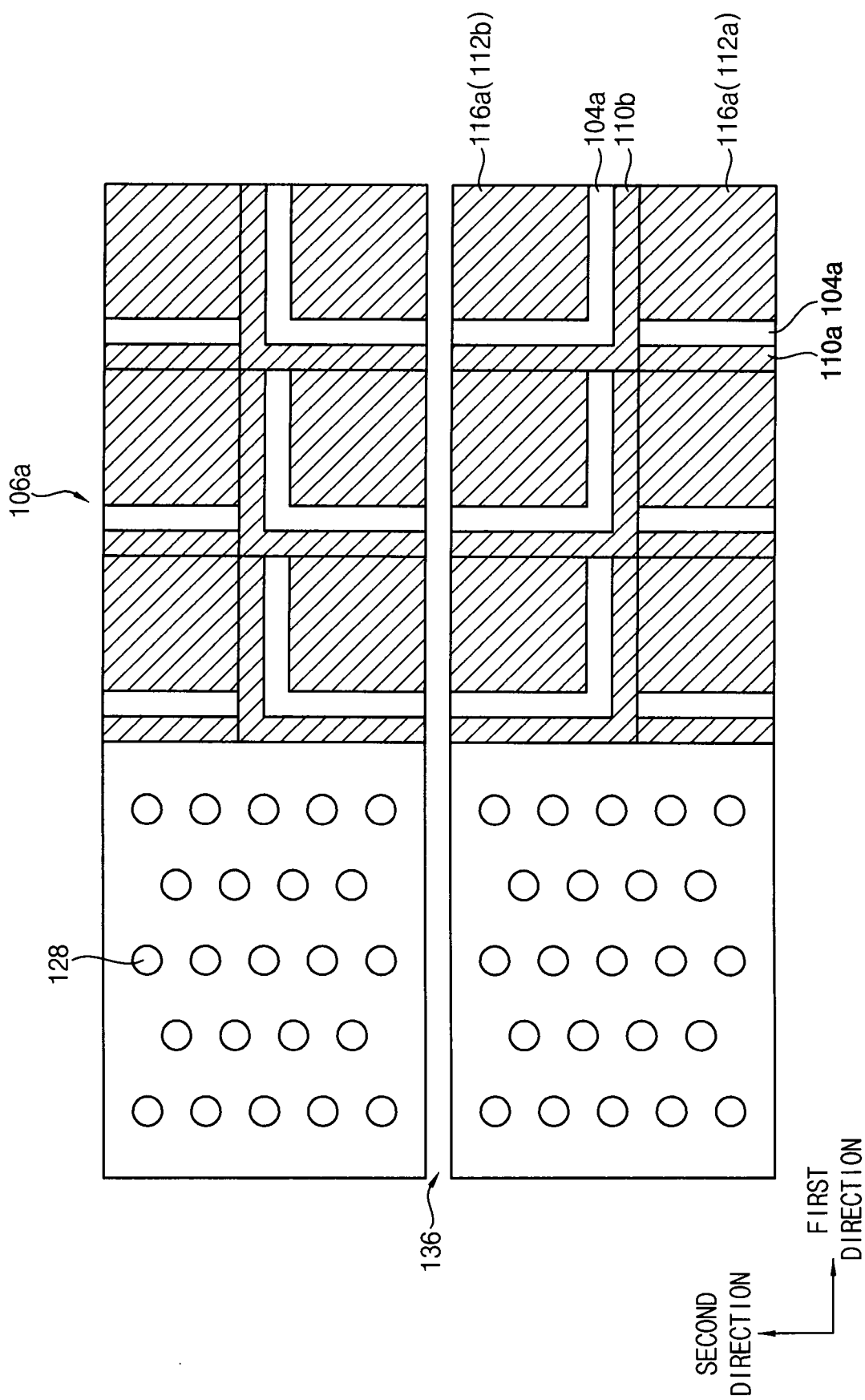

Referring to FIG. 16, the first upper interlayer insulation layer 120 may be formed to cover the preliminary conductive pattern structure 106. For example, the first upper interlayer insulation layer 120 may be formed to cover top and side surfaces of the preliminary conductive pattern structure 106, top and side surfaces of the spacers 110, side surfaces of the upper pad conductive layer 113, and top and side surfaces of the mask pattern 116a. An upper surface of the first upper interlayer insulation layer 120 may be planar.

In some embodiments, the first upper interlayer insulation layer 120 may be formed by forming an oxide layer including silicon oxide, silicon oxycarbide, or silicon oxyfluoride, and planarizing the oxide layer. The planarization process may include chemical mechanical polishing process and/or an etch back process.

Thereafter, channel holes may be formed to penetrate the first upper interlayer insulation layer 120 and the preliminary conductive pattern structure 106 to expose the substrate 100. The channel structure 128 may be formed in each of the channel holes, respectively. In some embodiments, the semiconductor pattern 122 contacting the substrate 100 may be formed below the channel structure 128. Thereafter, the second upper interlayer insulation layer 130 may be formed on the first upper interlayer insulation layer 120 and the preliminary conductive pattern structure 106. An upper surface of the second upper interlayer insulation layer 130 may be planar.

Specifically, the semiconductor pattern 122 may be formed by performing a selective epitaxial process on the substrate 100 exposed by the channel holes. The channel structure 128 including the dielectric structure 124a, the channel 124b, the buried insulation pattern 124c, and the upper conductive pattern 126 may be formed on the semiconductor pattern 122. The second upper interlayer insulation layer 130 may be formed on the first upper interlayer insulation layer 120 to cover the channel structure 128 and the first upper interlayer insulation layer 120.

Referring to FIG. 17, the first and second upper interlayer insulation layers 120 and 130 and the preliminary conductive pattern structure 106 may be anisotropically etched to form an opening 136 extending lengthwise in the first direction. The opening 136 may be formed to separate cell blocks of the memory device.

Thus, the preliminary conductive pattern structure 106 may be divided to form the conductive pattern structure 106a at each of opposite sides of the opening 136. The conductive pattern structure 106a may extend lengthwise in the first direction. The upper surface of the substrate 100 may be exposed by the opening 136. The conductive pattern structure 106a may include the insulation patterns 102a and the conductive patterns 104a.

In some embodiments, as shown in FIGS. 3 and 4, the pad region may be disposed on an upper surface of each stair of the conductive pattern structure 106a. As the opening 136 is formed, the preliminary pad conductive pattern 112 and the preliminary mask pattern 116 may be etched together to form the pad conductive pattern 112a and 112b and the mask pattern 116a. In addition, the spacer 110 may be cut by the formation of the opening 136.

In the conductive pattern structure 106a, the pad conductive pattern 112a and 112b may include the first pad conductive pattern 112a disposed remotely from the first spacer 110a and the second pad conductive pattern 112b disposed remotely from the second spacer 110b.

Since the second spacer 110b is formed on walls of the stairs in the first and second directions, an area of the second spacer 110b that covers the upper surface of the conductive pattern 104a may be greater than that of the first spacer 110a that is formed on a wall of the stair in only the first direction.

In some embodiments, an area of the upper surface of the second pad conductive pattern 112b may be the same as that of the upper surface of the first pad conductive pattern 112a. To this end, an area of the pad region positioned below the second pad conductive pattern 112b may be adjusted. For example, a length of the pad region positioned below the second pad conductive pattern 112b in the second direction may be greater than a length of the pad region positioned below the first pad conductive pattern 112a in the second direction.

In some embodiments, the area of the upper surface of the second pad conductive pattern 112b may be different from the area of the upper surface of the first pad conductive pattern 112a.

Figure 18:
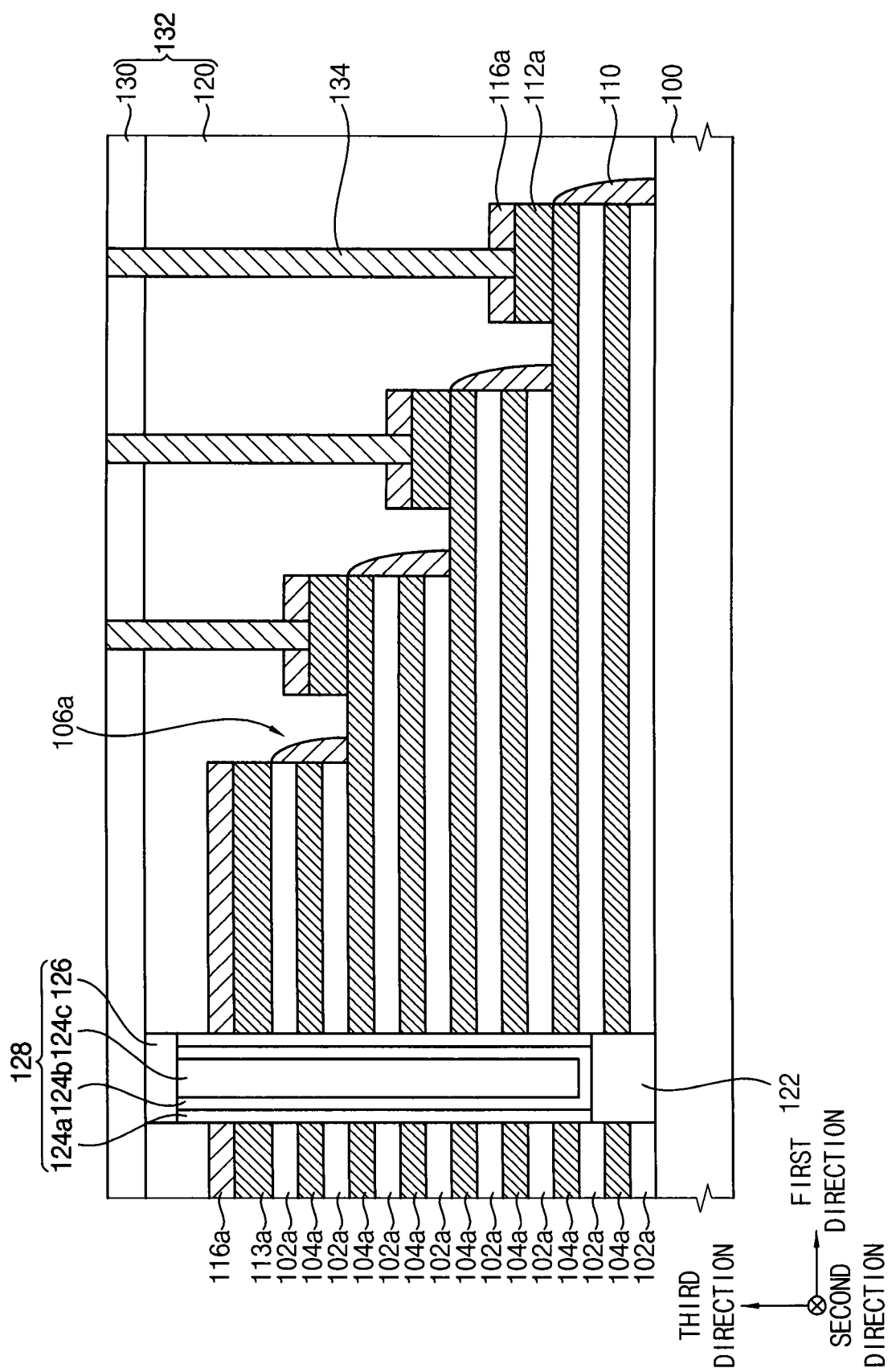

Referring to FIG. 18, the contact plug 134 may be formed to penetrate the first and second upper interlayer insulation layers 120 and 130 to contact the pad conductive pattern 112a and 112b. In the etch process for forming the contact plug 134, the mask pattern 116a on the pad conductive pattern 112a and 112b may be used as an etch mask.

Specifically, the first and second upper interlayer insulation layers 120 and 130 may be etched to form a preliminary contact hole exposing an upper surface of the mask pattern 116a on the pad conductive pattern 112a and 112b. The first and second upper interlayer insulation layers 120 and 130 may be etched using the mask pattern 116a as an etch mask. Thereafter, the portion of the mask pattern 116a exposed by the preliminary contact hole may be removed, such that the contact hole may be formed to expose the pad conductive pattern 112a and 112b. After barrier metal layer is formed on an inner surface of the contact hole and then a metal layer is formed on the barrier layer, the barrier metal layer and the metal layer may be planarized to expose the upper surface of the second upper interlayer insulation layer 130.

As the contact hole exposing the upper surface of the pad conductive pattern 112a and 112b is formed using the mask pattern 116a as the etch mask, a not-open defect of the contact hole (i.e., the upper surface of the pad conductive pattern 112a and 112b is not exposed by the contact hole) may be prevented.

A bottom surface of the contact hole may be positioned on or in the upper surface of the pad conductive pattern 112a and 112b (e.g., on or in an upper surface of a combination structure of the pad conductive pattern 112a and 112b and the conductive pattern 104a thereunder). Accordingly, an etch margin for forming the contact hole may be increased since a depth of the contact hole is decreased. That is, since the pad conductive pattern 112a and 112b is disposed on the conductive pattern 104a, the contact failure of the contact plug 134 may be reduced.

In some embodiments, in the case in which the mask pattern 116a includes silicon oxide, the mask pattern 116a and the first upper interlayer insulation layer 120 may be merged into a single insulation layer.

A wiring line may be formed on the second upper interlayer insulation layer 130 to be electrically connected to the contact plug 134. The wiring line may have a linear shape extending in the second direction.

Figure 19:
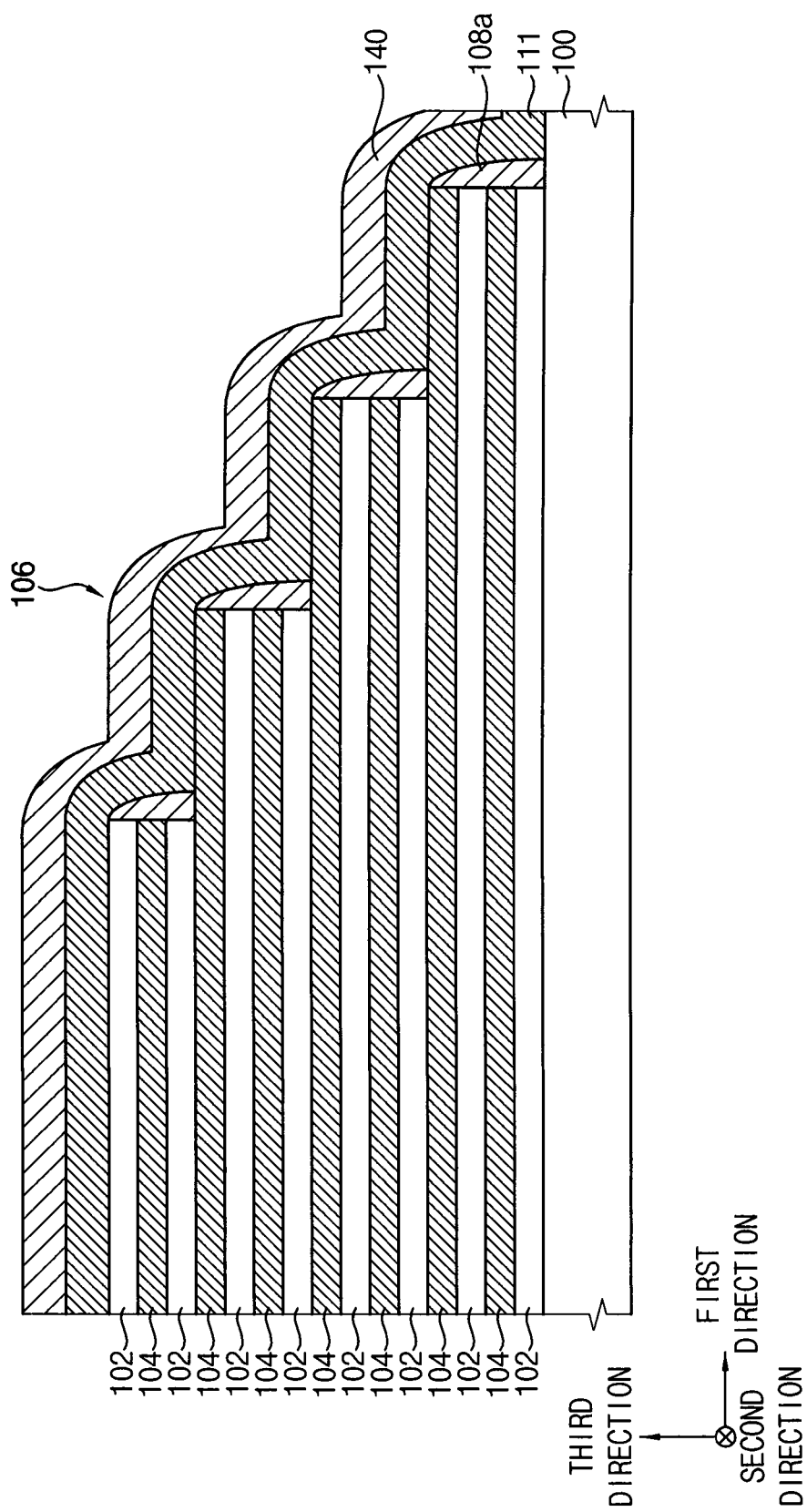
FIGS. 19 to 21 are cross-sectional views illustrating a method of manufacturing a vertical semiconductor device according to example embodiments.
Figure 20:
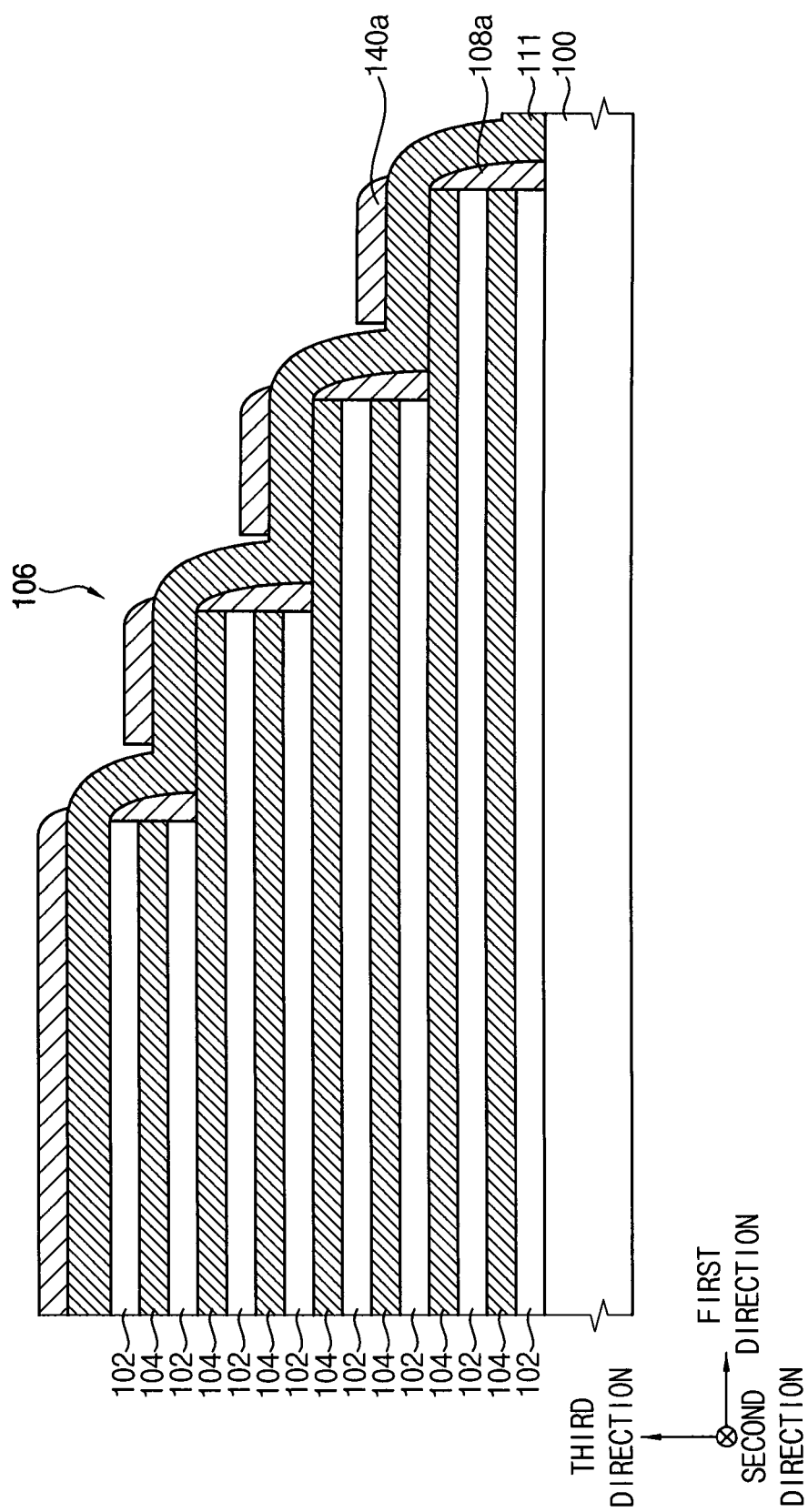
Figure 21:
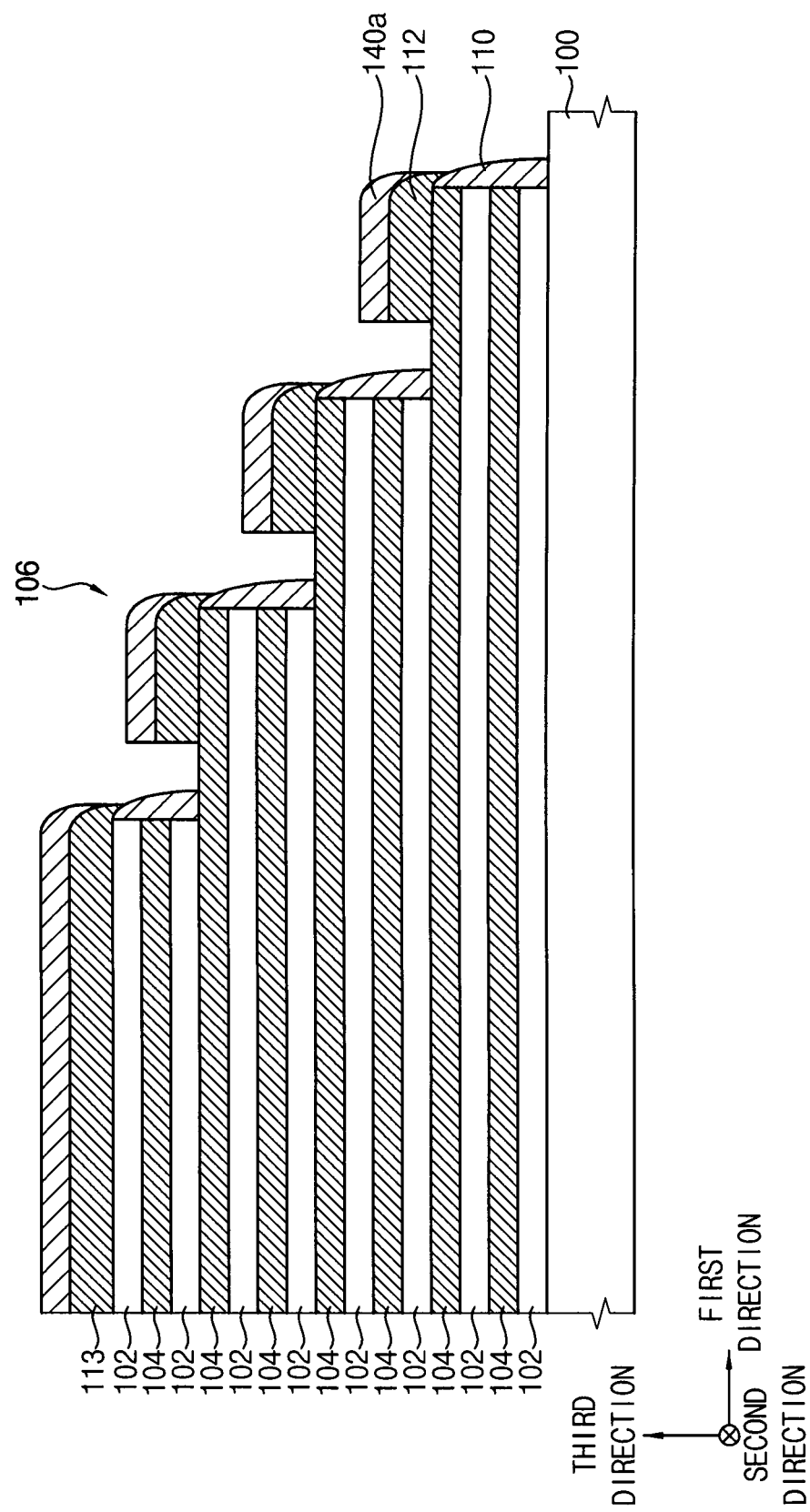

FIGS. 19 to 21 are cross-sectional views illustrating a method of manufacturing a vertical semiconductor device according to example embodiments.

A method of manufacturing a vertical semiconductor device according to example embodiments are the same as that described with reference to FIGS. 5 to 18, except for a method of forming a mask pattern.

The same processes as those described with reference to FIGS. 5 to 11 may be performed to form the pad conductive layer 111.

Referring to FIG. 19, a mask layer 140 may be formed on the pad conductive layer 111 to cover the preliminary conductive pattern structure 106 and the spacer 110. The mask layer 140 may be formed along a surface profile of the pad conductive layer 111. The mask layer 140 may include a planar portion and a sloped portion. A portion of the mask layer 140 on the spacer 110 may be the sloped portion. In the mask layer 140, the planar portion may be thicker than the sloped portion. In some embodiments, the planar portion of the mask layer 140 may have a first thickness, and the sloped portion thereof may be a second thickness smaller than the first thickness. The thickness of the first portion may be measured in the third direction from a lower surface to an upper surface of the mask layer 140. The thickness of the second portion may be measured at an angle (e.g., consistent with the slope) from the lower surface to the upper surface of the mask layer 140.

In some embodiments, the mask layer 140 may include silicon nitride. In some embodiments, the mask layer 140 may include silicon oxide.

Referring to FIG. 20, at least a portion of the slope portion of the mask layer 140 may be etched to form a preliminary mask pattern 140a. The etch process may include an isotropic etch process. In the etch process, the mask layer 140 may be etched by at least the second thickness.

When the etch process is performed, the planar portion of the mask layer 140 that is formed relatively thick may remain by a predetermined thickness, and the sloped portion of the mask layer 140 may be removed. Thus, the preliminary mask pattern 140a may cover a planar upper surface of the pad conductive layer 111. Additionally, a portion of the pad conductive layer 111 on the spacer 110 may be exposed.

Thereafter, substantially the same processes as described with reference to FIGS. 14 to 18 may be performed. Accordingly, the vertical semiconductor device shown in FIGS. 1 to 4 may be manufactured.

Figure 22:
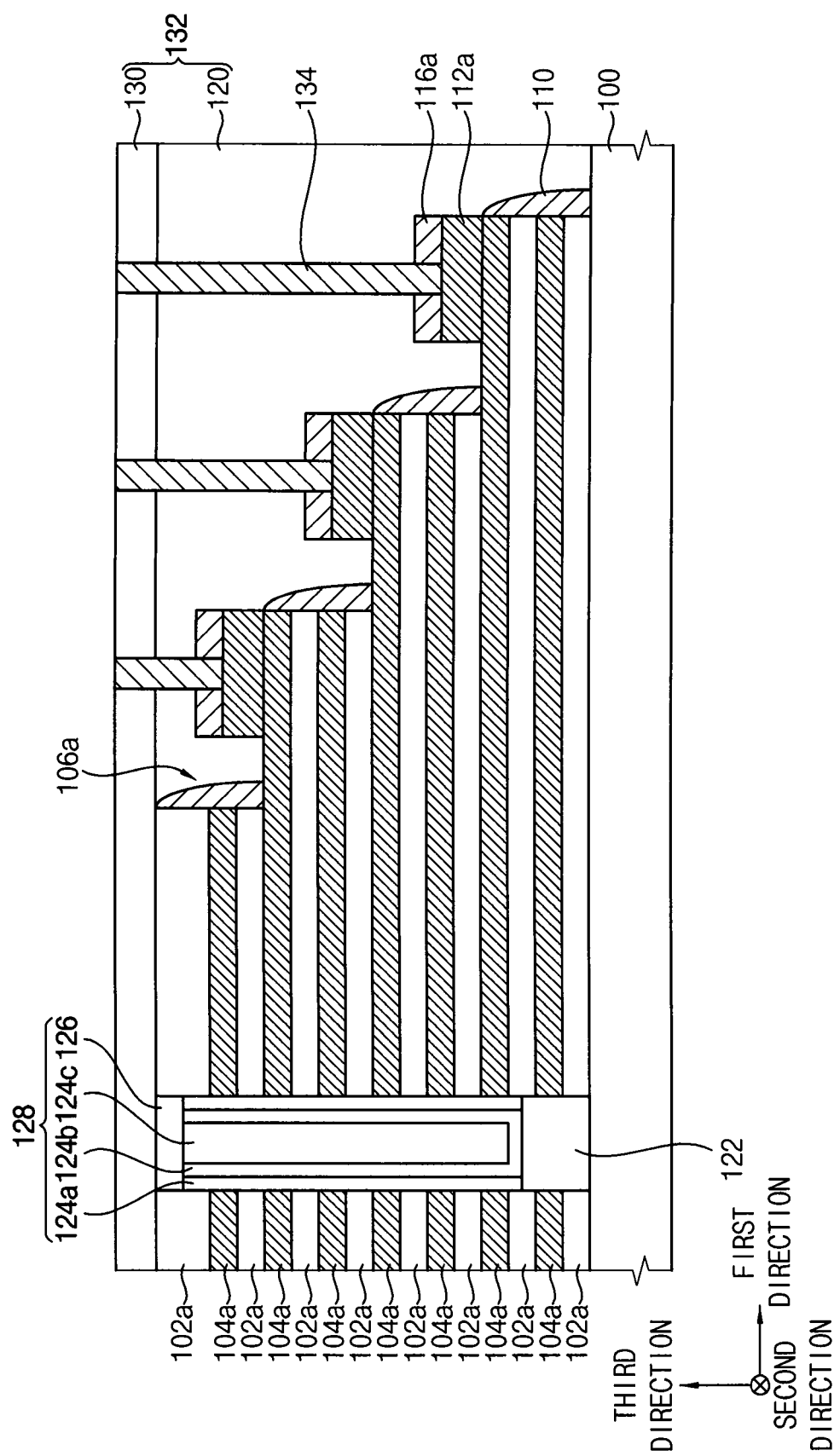
FIG. 22 is a cross-sectional view illustrating a vertical semiconductor device according to example embodiments.

FIG. 22 is a cross-sectional view illustrating a vertical semiconductor device according to example embodiments.

Referring to FIG. 22, a vertical semiconductor device according to example embodiments is substantially the same as the vertical semiconductor device described with reference to FIGS. 1 to 4, except that the upper pad conductive pattern 113a and the mask pattern 116a are not disposed on the conductive pattern structure.

The insulation pattern 102a may be disposed at an uppermost layer of the conductive pattern structure 106a. The insulation pattern 102a at the uppermost layer of the conductive pattern structure 106a may be thicker than the other insulation patterns 102a thereunder. In the embodiment of FIG. 22, the first upper interlayer insulation layer 120 may not cover the uppermost layer, including the uppermost insulation pattern 102a, but may cover the remaining steps of the conductive pattern structure 106a.

Figure 23:
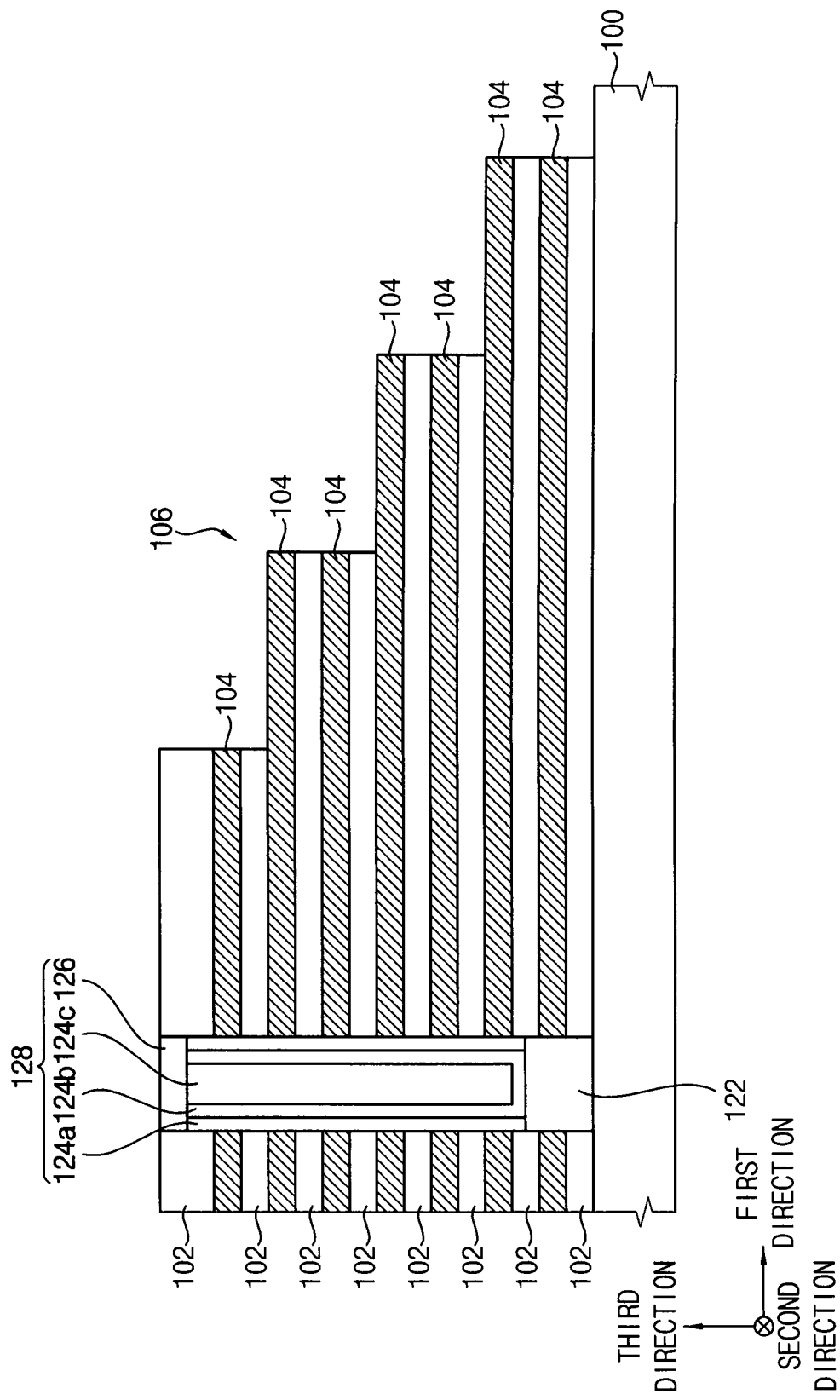
FIGS. 23 to 25 are cross-sectional views illustrating a method of manufacturing a vertical semiconductor device according to example embodiments.
Figure 24:
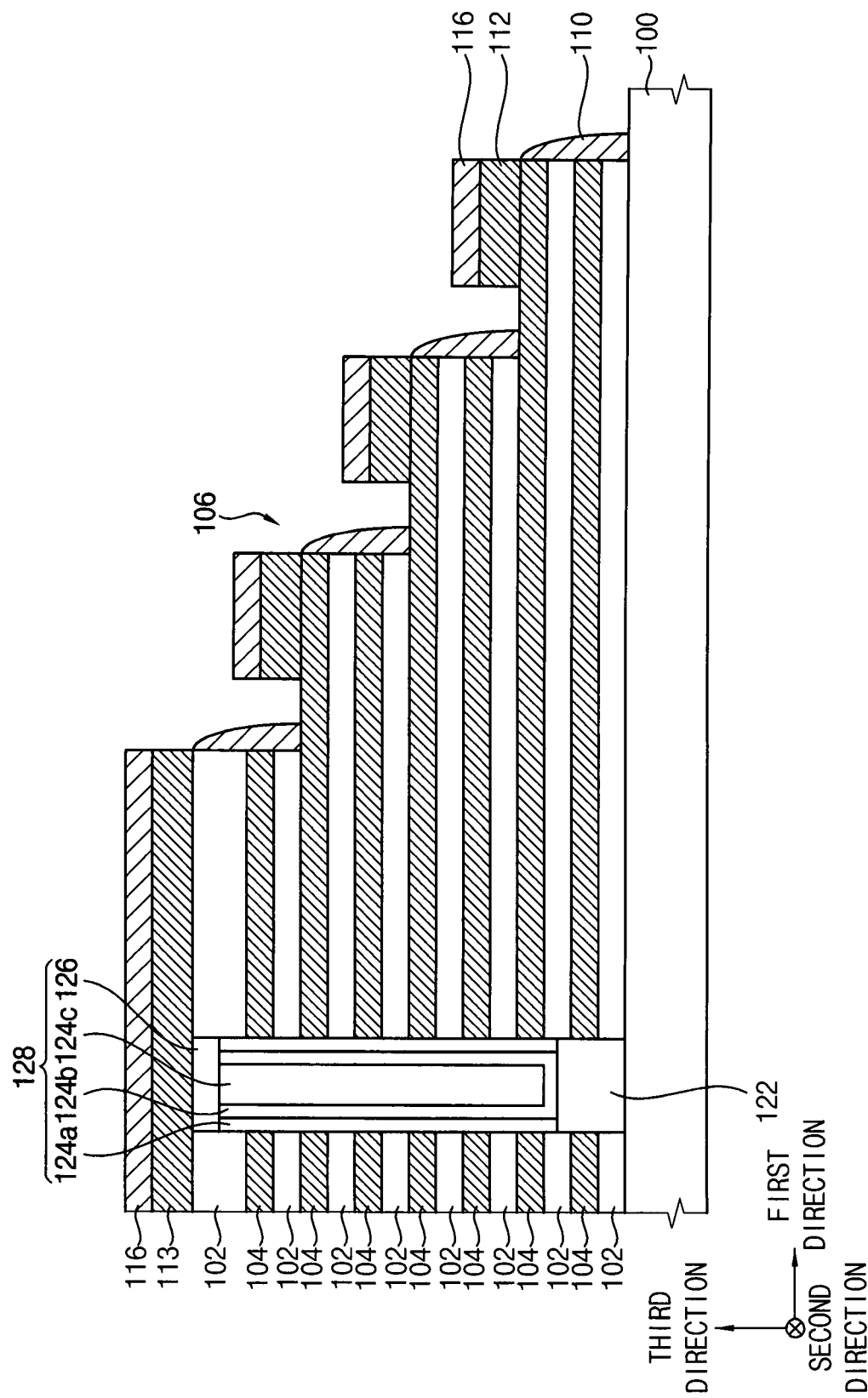
Figure 25:
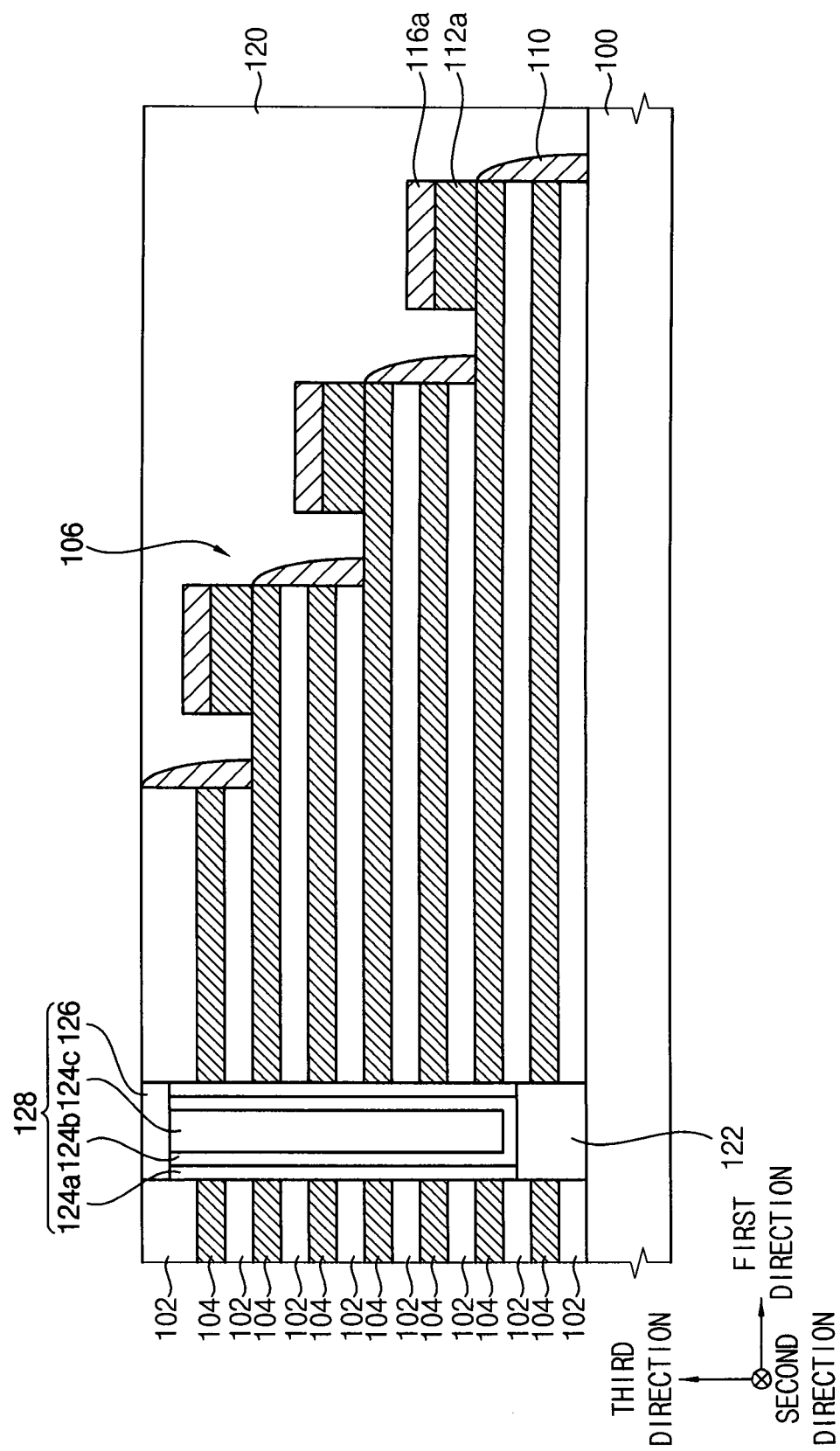

FIGS. 23 to 25 are cross-sectional views illustrating a method of manufacturing a vertical semiconductor device according to example embodiments.

Referring to FIG. 23, the preliminary conductive pattern structure 106, in which the insulation layers 102 and the conductive layers 104 are stacked on the substrate 100, may be formed to have a stair-stepped shape at an edge portion thereof. Upper surfaces of the conductive layers 104 may be exposed at the edge portion of the preliminary conductive pattern structure 106. The insulation layer 102 may be formed at an uppermost layer of the preliminary conductive pattern structure 106. The insulation layer 102 at the uppermost layer of the preliminary conductive pattern structure 106 may be thicker than other insulation layers 102 thereunder.

The channel holes may be formed to penetrate the preliminary conductive pattern structure 106 to expose the upper surface of the substrate 100. The channel structures 128 may be formed in each of the channel holes, respectively. The process of forming the channel structures 128 may be substantially the same as that described with reference to FIG. 16.

In some embodiments, the channel structure 128 may be formed before the preliminary conductive pattern structure 106 is formed. For example, the insulation layers 102 and the conductive layers 104 are alternately and repeatedly stacked on the substrate 100. The channel structure 128 may be formed on the substrate 100 to penetrate the insulation layers 102 and the conductive layers 104. Thereafter, the insulation layers 102 and the conductive layers 104 may be partly etched to form the preliminary conductive pattern structure 106 having a stair-stepped shape.

Referring to FIG. 24, the same processes as those described with reference to FIGS. 7 to 15 may be performed. Thus, the spacer 110, the preliminary pad conductive pattern 112, and a preliminary mask pattern 116 may be formed on the stair-stepped portion of the preliminary conductive pattern structure 106. The upper pad conductive layer 113 and the preliminary mask pattern 116 may be formed to cover an upper surface of the uppermost insulation layer 102 of the preliminary conductive pattern structure 106.

Referring to FIG. 25, an interlayer insulation layer may be formed to cover the preliminary conductive pattern structure 106. The interlayer insulation layer may cover the upper pad conductive layer 113 and the preliminary mask pattern 116 on the preliminary conductive pattern structure 106.

An upper portion of the interlayer insulation layer and the upper pad conductive layer 113 and the preliminary mask pattern 116 that are on the uppermost portion of the preliminary conductive pattern structure 106 may be removed by a planarization process. Thus, the upper pad conductive layer 113 and the preliminary mask pattern 116 may not be present on the preliminary conductive pattern structure 106. As a result, the first upper interlayer insulation layer 120 covering the stair-stepped portion of the preliminary conductive pattern structure 106 may be formed. The planarization process may include a chemical mechanical polishing process and/or an etch back process.

Referring again to FIG. 22, the second upper interlayer insulation layer 130 may be formed on the first upper interlayer insulation layer 120. Thereafter, the same processes as those described with reference to FIGS. 17 and 18 may be performed. Thus, the vertical semiconductor device shown in FIG. 22 may be manufactured.

Figure 26:
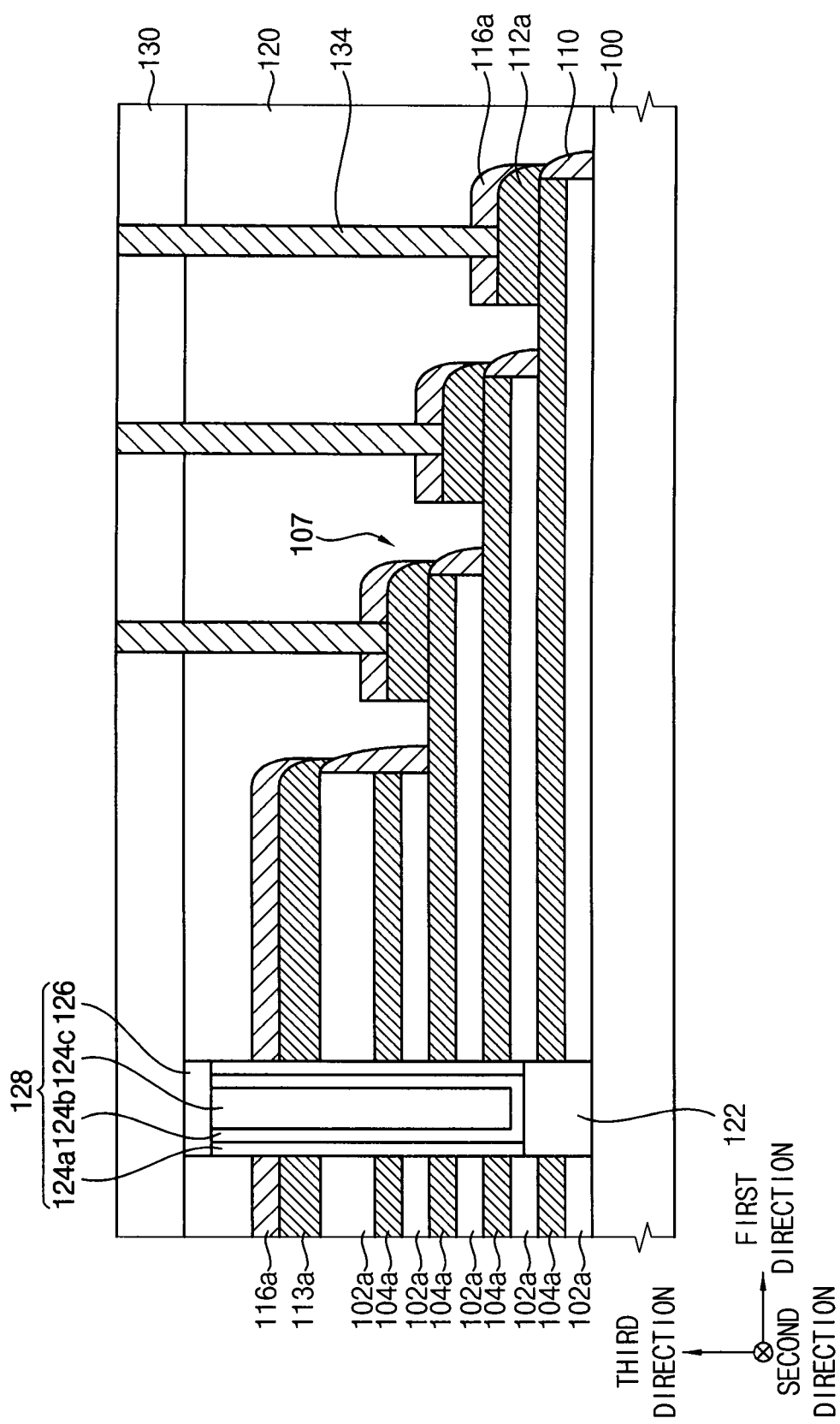
FIG. 26 is a cross-sectional view illustrating a vertical semiconductor device according to example embodiments.

FIG. 26 is a cross-sectional view illustrating a vertical semiconductor device according to example embodiments.

Referring to FIG. 26, a vertical semiconductor device according to example embodiments may be substantially the same as that described with reference to FIGS. 1 to 4, except that the conductive pattern structure has stairs formed in only the first direction.

A conductive pattern structure 107 may have stairs in only the first direction, and thus the spacer 110 may extend lengthwise in the second direction. In addition, an upper surface of the conductive pattern 104a exposed between the spacer 110 and the pad conductive pattern 112a may have a shape extending in the second direction.

The vertical semiconductor device may be formed by the same processes as those described with reference to FIGS. 5 to 18 or 19 to 21. However, the conductive pattern structure 107 may be formed to have the stairs in only the first direction by performing a photolithography and etch process.

Figure 27:
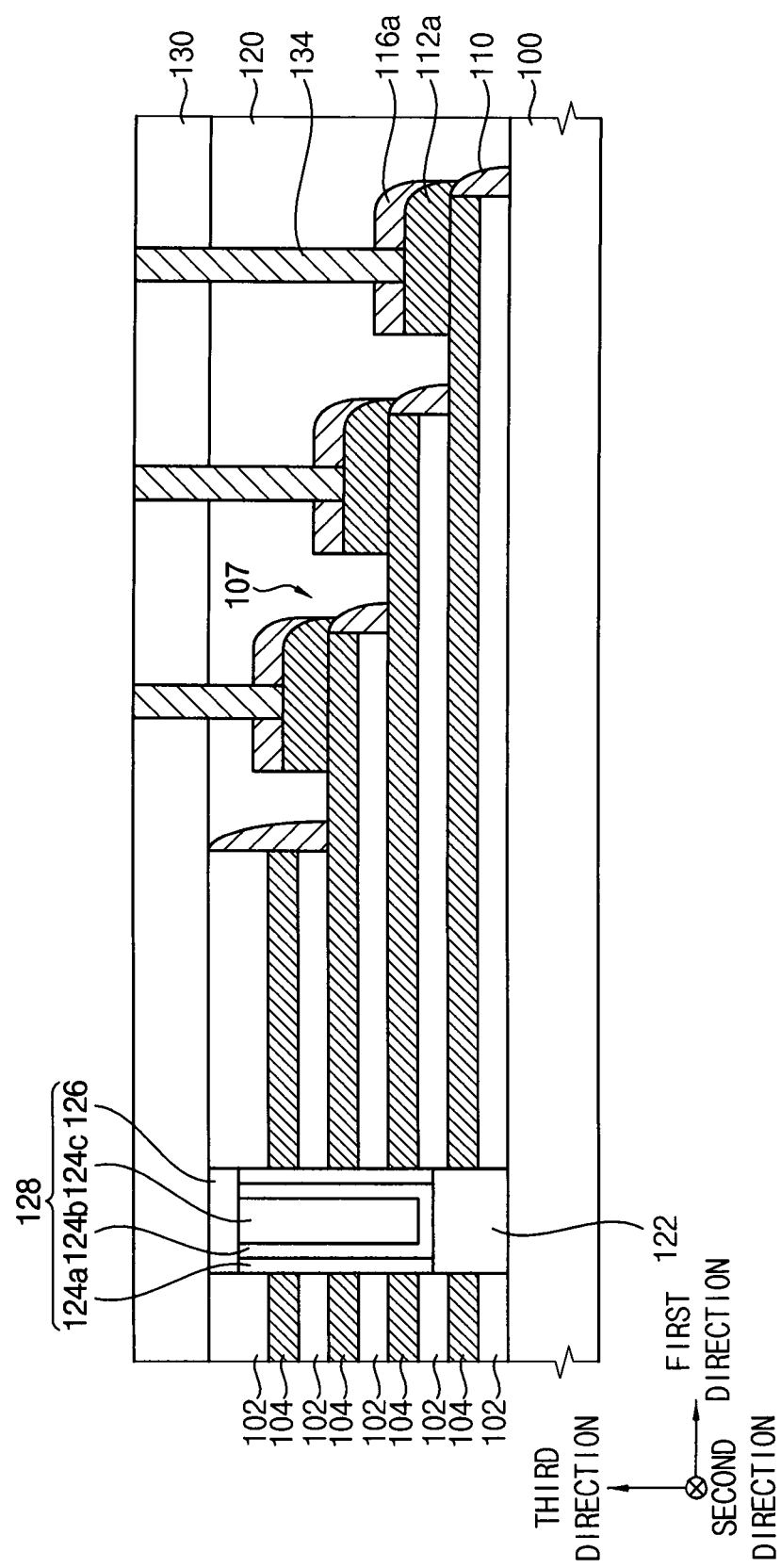
FIG. 27 is a cross-sectional view illustrating a vertical semiconductor device according to example embodiments.

FIG. 27 is a cross-sectional view illustrating a vertical semiconductor device according to example embodiments.

Referring to FIG. 27, a vertical semiconductor device may be substantially the same as that described with reference to FIG. 22, except that the conductive pattern structure has stairs formed in only the first direction.

The conductive pattern structure 107 may have stairs in only the first direction, and thus the spacer 110 may extend lengthwise in the second direction. In addition, an upper surface of the conductive pattern 104a exposed between the spacer 110 and the pad conductive pattern 112a may have a shape extending in the second direction.

The vertical semiconductor device may be formed by the same processes as those described with reference to FIGS. 23 to 25. However, the conductive pattern structure 107 may be formed to have the stairs in only the first direction by performing a photolithography and etch process.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A vertical semiconductor device comprising:
a substrate;
a conductive pattern structure in which insulation patterns and conductive patterns are stacked alternately and repeatedly on the substrate, wherein the conductive pattern structure includes an edge portion having a stair-stepped shape, and each of the conductive patterns includes a pad region having an upper surface that corresponds to an upper surface of a stair in the edge portion;
a spacer covering a sidewall of a stair of the edge portion of the conductive pattern structure;
a pad conductive pattern on and contacting a portion of the upper surface of the pad region;
a mask pattern on an upper surface of the pad conductive pattern; and
a contact plug penetrating the mask pattern to contact the pad conductive pattern.

2. The device of claim 1, wherein the pad conductive pattern contacting the portion of the upper surface of the pad region of a first one of the conductive patterns is spaced apart from a second one of the conductive patterns included in an adjacent stair.

3. The device of claim 1,
wherein the conductive patterns extend lengthwise in a first direction parallel to an upper surface of the substrate, and
wherein the pad conductive pattern contacts the upper surface of the pad region at an edge portion of each of the conductive patterns in the first direction.

4. The device of claim 1, wherein the pad conductive pattern is disposed remotely from the spacer.

5. The device of claim 1, wherein the conductive patterns and the pad conductive pattern include the same material or different materials.

6. The device of claim 1,
wherein the conductive patterns include polysilicon or metal, and
wherein the pad conductive pattern includes polysilicon or metal.

7. The device of claim 1, wherein the mask pattern includes silicon nitride or silicon oxide.

8. The device of claim 1,
wherein the conductive patterns extend in a first direction parallel to an upper surface of the substrate, and
wherein pad regions of the conductive patterns have a stair-stepped shape in the first direction.

9. The device of claim 1,
wherein the conductive patterns extend lengthwise in a first direction parallel to an upper surface of the substrate, and
wherein pad regions of the conductive patterns have a stair-stepped shape in the first direction and in a second direction perpendicular to the first direction and parallel to the upper surface of the substrate.

10. The device of claim 9, further comprising:
a first spacer on a wall of an upper stair contacting a first pad region corresponding to an upper surface of an uppermost stair in the second direction; and
a second spacer on walls of upper stairs contacting a second pad region corresponding to an upper surface of the stair below the uppermost stair in the second direction,
wherein the first spacer extends lengthwise in the second direction, and
wherein the second spacer includes a first portion extending lengthwise in the second direction and a second portion extending lengthwise in the first direction.

11. The device of claim 10, wherein the pad conductive pattern includes a first pad conductive pattern disposed remotely from the first spacer and a second pad conductive pattern disposed remotely from the second spacer.

12. The device of claim 11, wherein areas of upper surfaces of the first and second pad conductive patterns are equal to or different from each other.

13. The device of claim 1, further comprising:
an interlayer insulation layer covering the conductive pattern structure, the pad conductive pattern, and the mask pattern,
wherein the interlayer insulation layer has a planar upper surface, and
wherein the contact plug penetrates the interlayer insulation layer and the mask pattern.

14. A vertical semiconductor device comprising:
a substrate;
a conductive pattern structure in which insulation patterns and conductive patterns are stacked alternately and repeatedly on the substrate, wherein the conductive patterns extend in a first direction parallel to an upper surface of the substrate, edge portions of the conductive patterns have a stair-stepped shape in the first direction and in a second direction perpendicular to the first direction and parallel to the upper surface of the substrate, and the conductive patterns include pad regions corresponding to upper surfaces of stairs, respectively;
pad conductive patterns on the pad regions of the conductive patterns, respectively;
mask patterns on the pad conductive patterns, respectively;
contact plugs contacting the pad conductive patterns, respectively, and electrically connected to the conductive patterns, respectively;
a first spacer on a wall of an upper stair contracting each of the pad regions corresponding to an upper surface of an uppermost stair in the second direction; and
a second spacer on walls of upper stairs contacting each of the pad regions corresponding to an upper surface of the stair below the uppermost stair in the second direction.

15. The device of claim 14, wherein the pad conductive patterns include a first pad conductive pattern disposed remotely from the first spacer and a second pad conductive pattern disposed remotely from the second spacer.

16. The device of claim 14, further comprising:
a second pad conductive pattern and a second mask pattern on the second pad conductive pattern covering an uppermost insulation layer of the conductive pattern structure.

17. A vertical semiconductor device comprising:
a substrate;
a conductive pattern structure in which insulation patterns and conductive patterns are stacked alternately and repeatedly on the substrate, wherein the conductive pattern structure includes an edge portion having a stair-stepped shape, and each of the conductive patterns includes a pad region corresponding to an upper surface of a stair in the edge portion;
a spacer on a sidewall of the stair and contacting side surfaces of at least one conductive pattern of the conductive patterns and at least one insulation pattern of the insulation patterns;
a pad conductive pattern on the pad region and disposed remotely from the spacer;
a mask pattern on an upper surface of the pad conductive pattern; and
a contact plug penetrating the mask pattern to contact the pad conductive pattern.

18. The device of claim 17, wherein the mask pattern includes silicon nitride or silicon oxide.

19. The device of claim 1, wherein a sum of thicknesses of the pad conductive pattern on the pad region and the conductive pattern thereunder is greater than a thickness of each of the conductive patterns.

20. The device of claim 14, wherein a sum of thicknesses of one of the pad conductive patterns on the pad regions and the conductive pattern thereunder is greater than a thickness of each of the conductive patterns.

* * * * *